US012476596B2

(12) United States Patent
Nakao et al.

(10) Patent No.: US 12,476,596 B2
(45) Date of Patent: Nov. 18, 2025

(54) RECEPTION CIRCUIT

(71) Applicant: SONY SEMICONDUCTOR SOLUTIONS CORPORATION, Kanagawa (JP)

(72) Inventors: Hiroshi Nakao, Kanagawa (JP); Naoto Yanase, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 634 days.

(21) Appl. No.: 17/791,430

(22) PCT Filed: Dec. 10, 2020

(86) PCT No.: PCT/JP2020/045981
§ 371 (c)(1),
(2) Date: Jul. 7, 2022

(87) PCT Pub. No.: WO2021/145109
PCT Pub. Date: Jul. 22, 2021

(65) Prior Publication Data
US 2023/0038083 A1 Feb. 9, 2023

(30) Foreign Application Priority Data
Jan. 16, 2020 (JP) ................ 2020-005433

(51) Int. Cl.
*H03F 3/45* (2006.01)
*H03F 1/22* (2006.01)
(52) U.S. Cl.
CPC ........... *H03F 3/45076* (2013.01); *H03F 1/22* (2013.01)
(58) Field of Classification Search
CPC .... H03F 3/45076; H03F 1/22; H03F 3/45183; H03F 3/45475; H03F 2200/405;
(Continued)

(56) References Cited

U.S. PATENT DOCUMENTS 5,610,557 A * 3/1997 Jett, Jr. ............... H03F 3/45121
330/261
6,194,962 B1 * 2/2001 Chen ................... H03F 3/45766
330/253
(Continued)

FOREIGN PATENT DOCUMENTS

| JP | 2011-044795 A | 3/2011 |
| JP | 2015-012479 A | 1/2015 |
| JP | 2017-038212 A | 2/2017 |

OTHER PUBLICATIONS

International Search Report and Written Opinion of PCT Application No. PCT/JP2020/045981, issued on Mar. 16, 2021, 09 pages of ISRWO.

*Primary Examiner* — Hieu P Nguyen
(74) *Attorney, Agent, or Firm* — CHIP LAW GROUP

(57) ABSTRACT

Provided is a reception circuit that suppresses skew of a waveform of a signal and enables high-speed data communication.

A reception circuit according to the present disclosure includes: a first differential stage that receives a first input signal and a second input signal at a first input unit and a second input unit, respectively, and causes first and second currents corresponding to the first and second input signals, respectively, to flow; a second differential stage including a first current path that generates and outputs a first amplified signal corresponding to the first current and a second current path that generates and outputs a second amplified signal corresponding to the second current; a power supply line that supplies power to the first and second differential stages; and at least one variable resistance unit provided in the first or second current path.

16 Claims, 15 Drawing Sheets

(58) Field of Classification Search
CPC ....... H03F 2203/45652; H03F 3/45192; H04L 25/0272; H04L 25/0292; H03K 19/0175
USPC ................................................. 330/252–261
See application file for complete search history.

(56) References Cited

U.S. PATENT DOCUMENTS

| | | | |
|---|---|---|---|
| 7,683,720 B1 * | 3/2010 | Yehui | .................. H03F 3/45192 |
| | | | 30/304 |
| 9,136,904 B2 | 9/2015 | Ali et al. | |
| 2014/0036982 A1 | 2/2014 | Ali et al. | |

* cited by examiner

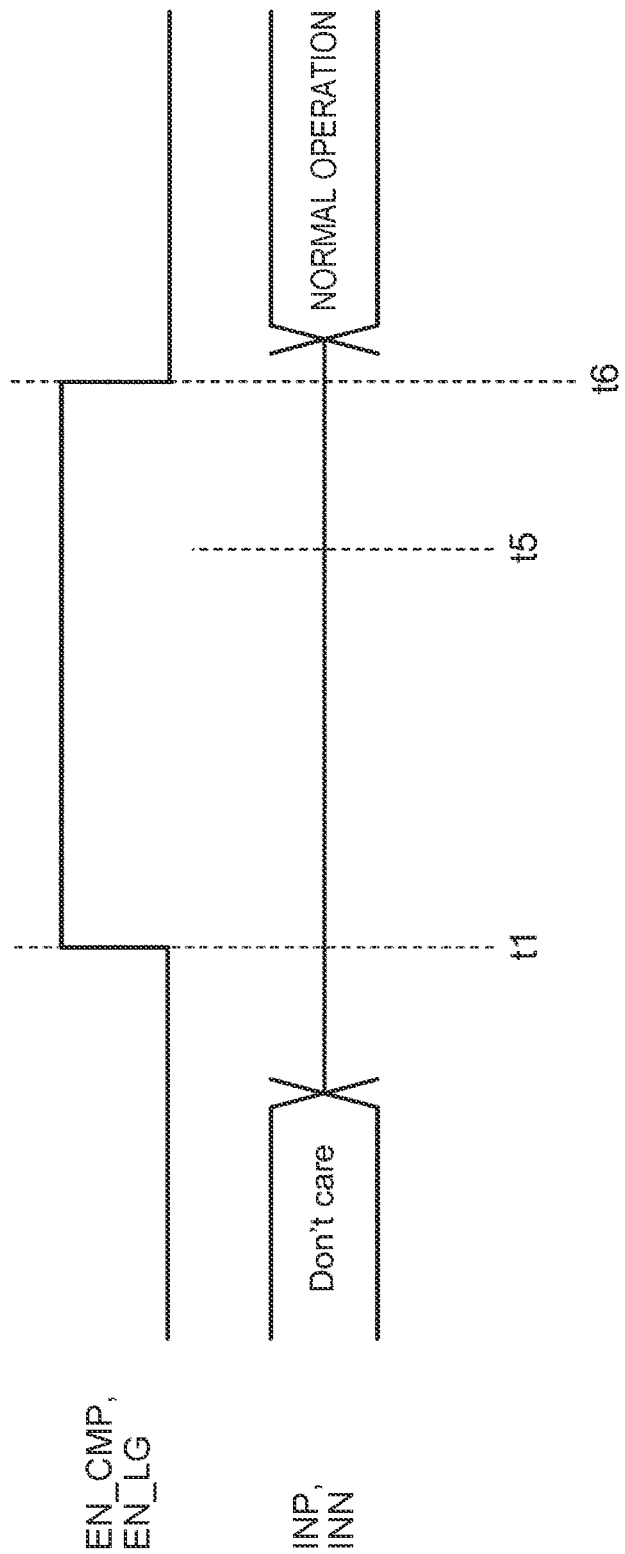

RECEPTION CIRCUIT

CROSS REFERENCE TO RELATED APPLICATIONS

This application is a U.S. National Phase of International Patent Application No. PCT/JP2020/045981 filed on Dec. 10, 2020, which claims priority benefit of Japanese Patent Application No. JP 2020-005433 filed in the Japan Patent Office on Jan. 16, 2020. Each of the above-referenced applications is hereby incorporated herein by reference in its entirety.

TECHNICAL FIELD

The present disclosure relates to a reception circuit.

BACKGROUND ART

In a high-speed interface such as low voltage differential signaling (LVDS), mobile industry processor interface (MIPI), and the like, a small amplitude differential signal is propagated between a transmitter and a receiver. A reception circuit amplifies such a small amplitude differential signal into a logic signal by an amplifier. In a case where data and a clock are separately transmitted and synchronized in the reception circuit, the amplifier is provided for each of the data and the clock. Although such a data amplifier and a clock amplifier are manufactured so as to have the same configuration, some characteristic variations actually occur due to process variations and the like. The characteristic variations between the data amplifier and the clock amplifier appear in a delay difference between the data and the clock, leading to distortion (skew) of a waveform of the logic signal.

CITATION LIST

Patent Documents

Patent Document 1: Japanese Patent Application Laid-Open No. 2003-078511
Patent Document 2: Japanese Patent Application Laid-Open No. 2000-022677
Patent Document 3: Japanese Patent Application Laid-Open No. 2012-028943
Patent Document 4: Japanese Patent Application Laid-Open No. 2011-044795
Patent Document 5: Japanese Patent Application Laid-Open No. 2014-192588

SUMMARY OF THE INVENTION

Problems to be Solved by the Invention

Provided is a reception circuit that suppresses skew of a waveform of a signal and enables high-speed data communication.

Solutions to Problems

A reception circuit according to the present disclosure includes: a first differential stage that receives a first input signal and a second input signal at a first input unit and a second input unit, respectively, and causes first and second currents corresponding to the first and second input signals, respectively, to flow; a second differential stage including a first current path that generates and outputs a first amplified signal corresponding to the first current and a second current path that generates and outputs a second amplified signal corresponding to the second current; a power supply line that supplies power to the first and second differential stages; and at least one variable resistance unit provided in the first or second current path.

The variable resistance unit may include a first variable resistor provided in the first current path, and a second variable resistor provided in the second current path.

A storage unit that stores a resistance value of the variable resistance unit may be further included.

The variable resistance unit may include a first resistance block including a plurality of first resistance elements connected in parallel and a first switch provided between the plurality of first resistance elements, and a second resistance block including a plurality of second resistance elements connected in parallel and a second switch provided between the plurality of second resistance elements. The first and second resistance blocks may be connected in series between the power supply line and the first or second current path.

The reception circuit of the present disclosure may further include: a DC power supply that inputs the same signal to the first and second input units; and a comparison circuit that compares the first and second amplified signals when the same signal is input to the first and second input units. The variable resistance unit may be set so that a voltage difference between the first and second amplified signals decreases.

The reception circuit of the present disclosure may further include: a DC power supply that inputs the same signal to the first and second input units; one or a plurality of buffer circuits that is connected to an output of the second differential stage, and outputs third and fourth amplified signals by further amplifying the first and second amplified signals; and a comparison circuit that compares the third and fourth amplified signals when the same signal is input to the first and second input units. The variable resistance unit may be set so that a voltage difference between the third and fourth amplified signals decreases.

The reception circuit of the present disclosure may further include: a DC power supply that inputs the same signal to the first and second input units; a first switch provided between the DC power supply and the first input unit; and a second switch provided between the DC power supply and the second input unit.

The first and second switches may be brought into a conductive state in a case where the same signal is input from the DC power supply to the first and second input units, and the first and second switches may be brought into a non-conductive state in a case where the first and second input signals are input to the first and second input units as mutually complementary high frequency signals.

The reception circuit of the present disclosure may include: a first amplification unit and a second amplification unit each including the first differential stage, the second differential stage, the power supply line, and the variable resistance unit. The first amplification unit may receive and amplify data, and the second amplification unit may receive and amplify a clock signal.

The variable resistance unit may be provided between the power supply line and a transistor provided in the first or second current path.

The variable resistance unit may be provided between a transistor provided in the first or second current path and a ground terminal.

The reception circuit of the present disclosure may further include: a resistance control circuit that changes a resistance value of the variable resistance unit stepwise so that a voltage difference between the first and second amplified signals decreases on the basis of a comparison result of the comparison circuit, and sets the resistance value of the variable resistance unit on the basis of inversion of polarity of the voltage difference between the first and second amplified signals; and a storage unit that stores the resistance value of the variable resistance unit.

The storage unit may store a set resistance value of the variable resistance unit so as not to be rewritable.

The storage unit may store a setting of a set resistance value of the variable resistance unit so as to be rewritable.

The resistance control circuit may set the resistance value of the variable resistance unit in a period from when the first and second input units receive the first and second input signals complementary to each other in scanning of a certain scanning line of an image to when scanning of the next scanning line starts.

BRIEF DESCRIPTION OF DRAWINGS

FIG. 5B is a timing chart of a case where the skew correction processing is executed before shipment.

MODE FOR CARRYING OUT THE INVENTION

Figure 1:
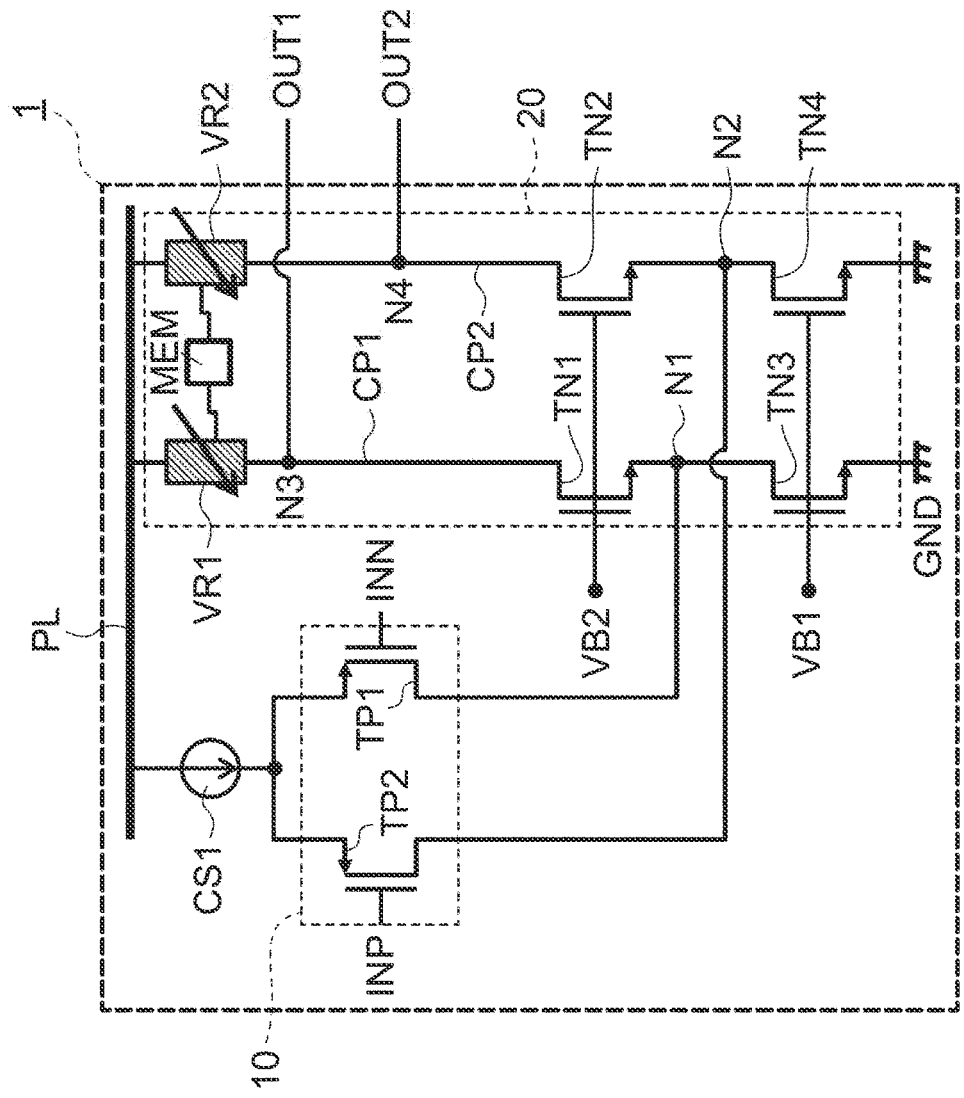
FIG. 1 is a diagram illustrating a configuration example of a reception circuit according to a first embodiment.

Hereinafter, embodiments according to the present invention will be described with reference to the drawings. The present embodiments do not limit the present invention. The drawings are schematic or conceptual, and a ratio of each portion and the like are not necessarily the same as actual ones. In the description and the drawings, elements similar to those described above with respect to the previously described drawings are denoted by the same reference numerals, and the detailed description thereof is appropriately omitted.

First Embodiment

FIG. 1 is a diagram illustrating a configuration example of a reception circuit according to a first embodiment. A reception circuit 1 includes a first differential stage 10, a second differential stage 20, a power supply line PL, variable resistors VR1 and VR2, a current source CS1, and a storage unit MEM. The reception circuit 1 is used, for example, for a high-speed interface such as LVDS or MIPI.

The power supply line PL is connected to a power supply (not illustrated), and is a wiring line provided for supplying power to the first and second differential stages 10 and 20 of the reception circuit 1. The current source CS1 is provided between the power supply line PL and the first differential stage 10, and is configured to supply a predetermined constant current to the first differential stage 10.

The first differential stage 10 includes P-type transistors TP1 and TP2 connected between the current source CS1 and the second differential stage 20. A source of the P-type transistor TP1 is connected to the current source CS1, and a drain thereof is connected to a node N1 of the second differential stage 20. A gate of the P-type transistor TP1 functions as a first input unit and receives a first input signal INN. A source of the P-type transistor TP2 is connected to the current source CS1, and a drain thereof is connected to a node N2 of the second differential stage 20. A gate of the P-type transistor TP2 functions as a second input unit and receives a second input signal INP. Configurations and electrical characteristics of the P-type transistors TP1 and TP2 are formed to be substantially the same. That is, the P-type transistors TP1 and TP2 are formed so as to be substantially symmetrical in configurations and electrical characteristics. In normal operation, the first and second input signals INN and INP are high frequency signals and are signals complementary to each other. Therefore, in a case where one of the first and second input signals INN and INP is a signal of a high-level voltage, another is a signal of a low-level voltage.

The first differential stage 10 causes first and second currents corresponding to the first and second input signals INN and INP to flow to the nodes N1 and N2, respectively. For example, in a case where the first input signal INN is at a high level and the second input signal INP is at a low level, the first differential stage 10 causes a larger current to flow to the node N2 than the node N1. Conversely, in a case where the first input signal INN is at a low level and the second input signal INP is at a high level, the first differential stage 10 causes a larger current to flow to the node N1 than the node N2.

As described above, the first differential stage 10 is a so-called folded cascode type amplifier circuit. However, a differential amplifier circuit other than the folded type may be used. Furthermore, the first differential stage 10 includes the P-type transistors TP1 and TP2, but may include N-type transistors.

The second differential stage 20 includes first and second current paths CP1 and CP2 connected between the power supply line PL and ground GND. The first current path CP1 includes the first variable resistor VR1, an N-type transistor TN1, and an N-type transistor TN3 connected in series between the power supply line PL and the ground GND. The first variable resistor VR1 is connected between the power supply line PL and a drain of the N-type transistor TN1. The first variable resistor VR1 is set to a resistance value stored in the storage unit MEM. The variable resistors VR1 and VR2 may include, for example, a metal wiring line, a polysilicon wiring line, a diffusion layer, and the like formed on a semiconductor substrate.

A source of the N-type transistor TN1 is connected to a drain of the N-type transistor TN3. A source of the N-type transistor TN3 is connected to the ground GND. The node N1 between the N-type transistor TN1 and the N-type transistor TN3 receives a first current from the P-type transistor TP1 of the first differential stage 10. A node N3 between the first variable resistor VR1 and the N-type transistor TN1 functions as an output node that outputs an output signal OUT1 corresponding to the first input signal INN.

The second current path CP2 includes the second variable resistor VR2, an N-type transistor TN2, and an N-type transistor TN4 connected in series between the power supply line PL and the ground GND. The second variable resistor VR2 is connected between the power supply line PL and a drain of the N-type transistor TN2. The second variable resistor VR2 is set to a resistance value stored in the storage unit MEM. However, there is a case where the resistance value of the second variable resistor VR2 is different from the resistance value of the first variable resistor VR1. This is to appropriately correct symmetry of electrical characteristics of the first current paths CP1 and CP2 as described above.

A source of the N-type transistor TN2 is connected to a drain of the N-type transistor TN4. A source of the N-type transistor TN4 is connected to the ground GND. The node N2 between the N-type transistor TN2 and the N-type transistor TN4 receives a first current from the P-type transistor TP2 of the first differential stage 10. A node N4 between the second variable resistor VR2 and the N-type transistor TN2 functions as an output node and outputs an output signal OUT2. It functions as an output node that outputs the output signal OUT2 corresponding to the second input signal INP.

Configurations and electrical characteristics of the N-type transistors TN1 and TN2 are formed to be substantially the same. Furthermore, configurations and electrical characteristics of the N-type transistors TN3 and TN4 are formed to be substantially the same.

A predetermined voltage VB2 is applied to each gate of the N-type transistors TN1 and TN2. A predetermined voltage VB1 is applied to each gate of the N-type transistors TN3 and TN4. Therefore, the N-type transistors TN1 and TN2 are brought into a conductive state or a non-conductive state at the same timing. The N-type transistors TN3 and TN4 are also brought into a conductive state or a non-conductive state at the same timing.

The storage unit MEM stores resistance values of the first and second variable resistors VR1 and VR2. The storage unit MEM may be either a volatile memory or a nonvolatile memory. Furthermore, the storage unit MEM may be an electrically rewritable memory such as an electrically erasable programmable read only memory (EEPROM), or may be a memory or a register that cannot be rewritten such as a fuse.

The first current path CP1 generates and outputs a first amplified signal corresponding to the first current depending on the input signal INN as the output signal OUT1. The second current path CP2 generates and outputs a second amplified signal corresponding to the second current depending on the input signal INP as the output signal OUT2. Since the input signals INN and INP are amplified in the first and second differential stages 10 and 20 and output as the output signals OUT1 and OUT2, the output signals OUT1 and OUT2 are signals complementary to each other similarly to the input signals INN and INP.

Here, the resistance values of the variable resistors VR1 and VR2 are set in order to make the electrical characteristics of the current paths CP1 and CP2 substantially equal to each other.

In general, a plurality of semiconductor elements designed and manufactured equal to each other has variations in electrical characteristics due to process variations and the like. For example, although the P-type transistors TP1 and TP2, the N-type transistors TN1 and TN2, and the N-type transistors TN3 and TN4 are designed and manufactured equal to each other, respectively, they have variations in electrical characteristics to some extent due to process variations and the like. Such variations between the transistors TP1 and TP2 of the first differential stage 10 or variations between the current paths CP1 and CP2 of the second differential stage 20 deteriorate symmetry and cause distortion of waveforms of the output signals OUT1 and OUT2. That is, the output signals OUT1 and OUT2 deviate from an ideal rising time point or an ideal falling time point. The distortion of the waveforms and the deviation from the rising time point or the falling time point are referred to as skew.

In the present disclosure, the same signal is supplied from a DC power supply to the first and second input units of the reception circuit 1 in order to detect relative variations of the semiconductor elements constituting such a reception circuit. That is, instead of the high frequency signals, the DC power supply inputs the same DC signal to the first and second input units of the reception circuit 1 as the first and second input signals INN and INP. Therefore, if an operating point of the reception circuit 1 due to the DC power is corrected, the skew in the high frequency signals can also be reduced.

In the present disclosure, as illustrated in FIG. 1, the variable resistors VR1 and VR2 are provided in the current paths CP1 and CP2, respectively, instead of a constant current source, in order to correct the operating point of the reception circuit. The resistance values of the variable resistors VR1 and VR2 are set such that a voltage difference between the output signals OUT1 and OUT2 output from the reception circuit 1 that has supplied the DC power is minimized. For example, the same DC voltage is input as the first input signals INN and INP, and the output signals OUT1 and OUT2 output from the current paths CP1 and CP2 are detected. At this time, in a case where the transistors TP1 and TP2 of the first differential stage 10 are symmetric (no variation) and the current paths CP1 and CP2 of the second differential stage 20 are symmetric (no variation), the voltage difference between the output signals OUT1 and OUT2 should be zero. That is, in a case where there is no problem in the symmetry of the reception circuit 1, the voltage difference between the output signals OUT1 and OUT2 becomes zero. However, in practice, there are some variations in the transistors TP1 and TP2 of the first differential stage 10, and there are also some variations in the current paths CP1 and CP2 of the second differential stage 20. Therefore, the voltage difference between the output signals OUT1 and OUT2 has a magnitude corresponding to the variations.

Therefore, in the present disclosure, one or both of the variable resistors VR1 and VR2 are changed so as to reduce the voltage difference between the output signals OUT1 and OUT2. For example, in a case where OUT1>OUT2, the resistance value of the variable resistor VR1 is increased and/or the resistance value of the variable resistor VR2 is decreased. In a case where OUT1<OUT2, the resistance value of the variable resistor VR1 is decreased and/or the resistance value of the variable resistor VR2 is increased. When the resistance values of the variable resistors VR1 and VR2 are changed in this manner, voltages of the output signals OUT1 and OUT2 approach each other, and a magnitude relationship therebetween is reversed. The resistance values of the variable resistors VR1 and VR2 before and after the magnitude relationship of the voltages of the output signals OUT1 and OUT2 is reversed are stored in the storage unit MEM. Therefore, the resistance values of the variable resistors VR1 and VR2 are set so that the voltage difference between the output signals OUT1 and OUT2 is minimized. As a result, the variations in the transistors TP1 and TP2 of the first differential stage 10 and the variations in the current paths CP1 and CP2 of the second differential stage 20 are substantially canceled, and the symmetry of the reception circuit 1 is corrected.

After setting the resistance values of the variable resistors VR1 and VR2, the reception circuit 1 enters the normal operation, and receives the high frequency signals as the first and second input signals INN and INP. At this time, since the symmetry of the reception circuit 1 has been corrected, skew of the output signals OUT1 and OUT2 is reduced.

As described above, in the present disclosure, the skew of the output signals OUT1 and OUT2 of the reception circuit 1 due to the high frequency signals can be suppressed by correcting the deviation of the operating point of the reception circuit 1 with the same DC voltage. By suppressing the skew of the output signals OUT1 and OUT2, the reception circuit 1 can perform high-speed data communication.

The reception circuit 1 illustrated in FIG. 1 includes both the variable resistors VR1 and VR2. However, at least only one of the variable resistor VR1 or VR2 may be provided as long as the deviation of the operating point of the reception circuit 1 can be corrected.

Figure 2:
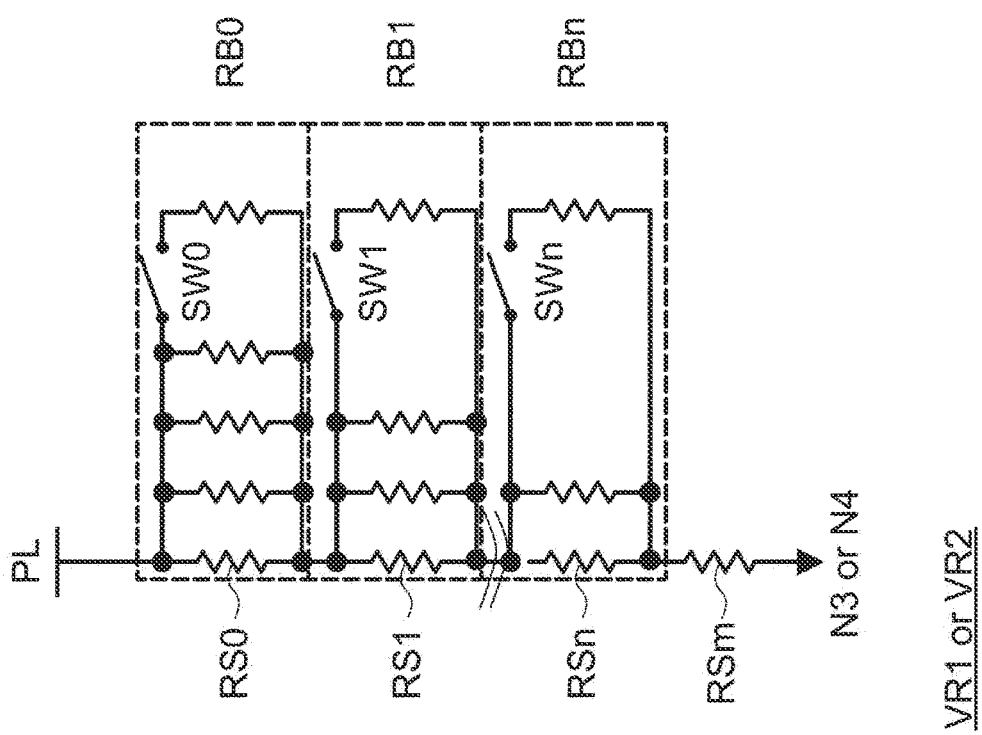
FIG. 2 is a circuit diagram illustrating an example of a configuration of a variable resistor.

FIG. 2 is a circuit diagram illustrating an example of a configuration of the variable resistor VR1 or VR2. The variable resistor VR1 or VR2 is connected between the power supply line PL and the node N3 or N4, respectively, and includes a plurality of resistance blocks RB0 to RBn configured by resistance elements RS0 to RSn and switches SW0 to SWn (n is an integer of 0 or more).

The resistance block RB0 includes the plurality of resistance elements RS0 connected in parallel to each other and the switch SW0 provided between the plurality of resistance elements RS0. The number of resistance elements RS0 and a position of the switch SW0 are not particularly limited. The resistance block RB1 includes the plurality of resistance elements RS1 connected in parallel to each other and the switch SW1 provided between any plurality of resistance elements RS1. The number of the resistance elements RS1 and a position of the switch SW1 are also not particularly limited. The resistance block RBn includes the plurality of resistance elements RSn connected in parallel to each other and the switch SWn provided between any plurality of resistance elements RS2. The number of resistance elements RSn and a position of the switch SWn are also not particularly limited.

The resistance elements RS0 to RSn and RSm have different resistance values. For example, the resistance elements RS0 to RSn and RSm may be configured such that the resistance values increase in this order. Furthermore, the resistance value of each of the resistance elements may also be changed in each of the resistance blocks RB0 to RBn.

The resistance blocks RB0 to RBn and the resistance element Rm are connected in series between the power supply line PL and the node N3 or N4.

With such a configuration, the resistance value of the variable resistor VR1 or VR2 can be changed stepwise by turning on (conductive state) or off (non-conductive state) the switches SW0 to SWn. For example, when all of the switches SW0 to SWn are turned on, the resistance value of the variable resistor VR1 or VR2 is the lowest. In order to increase the resistance value of the variable resistor VR1 or VR2 by one step, the switch SW0 is turned off. Similarly, by turning off any one of the switches SW1 to SWn, the resistance value of the variable resistor VR1 or VR2 increases stepwise. Moreover, by simultaneously turning off any two or more of the switches SW0 to SWn, the resistance value of the variable resistor VR1 or VR2 further increases. As described above, the resistance value of the variable resistor VR1 or VR2 is variable in $2^n$ steps and can be controlled by an n-bit signal. On/off states of the switches SW0 to SWn are only required to be stored in the storage unit MEM as n-bit signals.

Furthermore, since the reception circuit 1 of the high-speed interface is required to operate at a high speed, it is preferable that a capacitive load of the variable resistor VR1 or VR2 is as small as possible and an adjustment range of the resistance value can be finely set. The configuration of the variable resistor VR1 or VR2 illustrated in FIG. 2 is excellent in that the capacitive load is small and the adjustment range of the resistance value can be finely set.

Figure 3:
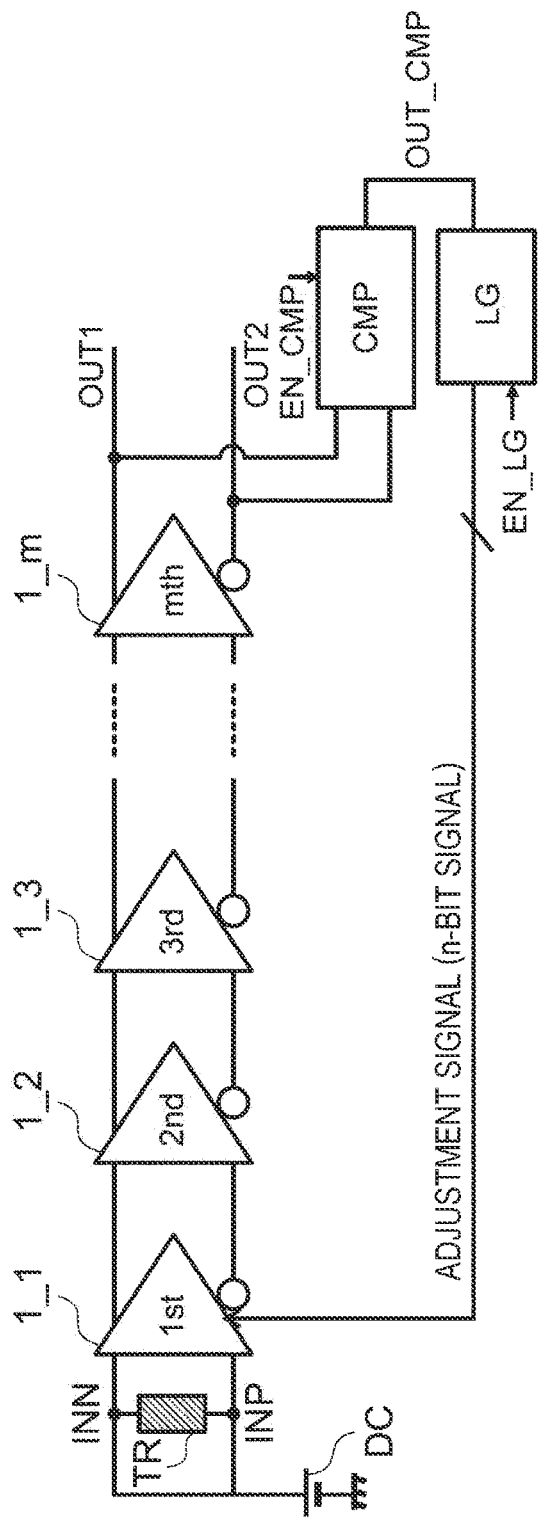
FIG. 3 is a diagram illustrating a state of skew correction processing of the reception circuit according to the first embodiment.

FIG. 3 is a diagram illustrating a state of skew correction processing of the reception circuit according to the first embodiment. Note that FIG. 3 illustrates a state of skew correction processing of a plurality of reception circuits 1_1 to 1_m (m is an integer of 1 or more) connected in series in multiple stages. The plurality of reception circuits 1_1 to 1_m connected in series can obtain a large gain, but skew of the output signals OUT1 and OUT2 also tends to increase. Of course, the skew correction processing may be executed for a single reception circuit (m=1).

In such skew correction processing of the reception circuits 1_1 to 1_m, a DC power supply DC is commonly connected to the two input units of the reception circuit 1, and DC signals having substantially the same voltage are input as the input signals INN and INP. A comparison circuit CMP is connected to two output units of the reception circuit 1_m of a final stage, and compares the output signals OUT1 and OUT2 when the same DC signal is input to the input units. An adjustment signal generation circuit LG as a resistance control circuit receives a voltage difference between the output signals OUT1 and OUT2 as a comparison result of the comparison circuit CMP, generates an adjustment signal (n-bit signal) according to this voltage difference, and outputs the adjustment signal to the reception circuit 1_1. The adjustment signal generation circuit LG is a logic circuit that increments or decrements the n-bit signal on the basis of the voltage difference between the output signals OUT1 and OUT2. The reception circuit 1_1 adjusts a resistance value of the variable resistor VR1 or VR2 according to the adjustment signal. The variable resistor VR1 or VR2 is adjusted stepwise so that the voltage difference between the output signals OUT1 and OUT2 decreases. The adjustment signal generation circuit LG sets (fixes) the resistance value of the variable resistor VR1 or VR2 on the basis of inversion of polarity of the voltage difference between the output signals OUT1 and OUT2. Therefore, the skew of the reception circuits 1_1 to 1_m between the DC power supply DC and the comparison circuit CMP can be corrected.

By changing connection positions of the DC power supply DC and the comparison circuit CPM, the reception circuit that executes skew correction can be changed. For example, if the comparison circuit CMP is connected to output units of the reception circuit 1_1, skew of only the reception circuit 1_1 can be corrected. If the comparison circuit CMP is connected to output units of the reception circuit 1_3, skew of the reception circuit 1_1 to 1_3 can be corrected. In this way, by changing the connection position of the comparison circuit CPM, it is possible to selectively correct skew of any reception circuit among the reception circuits 1_1 to 1_m between the DC power supply DC and the comparison circuit CMP. Similarly, even if the connection position of the DC power supply DC is changed, skew of any reception circuit can be selectively corrected.

Furthermore, the variable resistor VR1 or VR2 of the reception circuit 1_1 is changed in FIG. 3, but the variable resistors VR1 or VR2 of any reception circuit of the reception circuits 1_1 to 1_m may be corrected.

After the skew correction processing, the DC power supply DC, the comparison circuit CMP, and the adjustment signal generation circuit LG may be removed from the reception circuit 1. The reception circuit 1 stores settings of the resistance values of the variable resistors VR1 and VR2 in the storage unit MEM. Hence, thereafter, the reception circuit 1 can receive high frequency signals in a corrected state.

Note that a reception circuit at a stage subsequent to the reception circuit to which the DC power supply DC is connected (for example, the reception circuits 1_2 to 1_m in FIG. 3) may be considered as a buffer circuit. Therefore, in FIG. 3, it may be said that skew of the reception circuit 1_2 and one or a plurality of buffer circuits connected to the subsequent stage thereof (1_2 to 1_m) is corrected. Furthermore, the output signals OUT1 and OUT2 are examples of third and fourth amplified signals.

Figure 4:
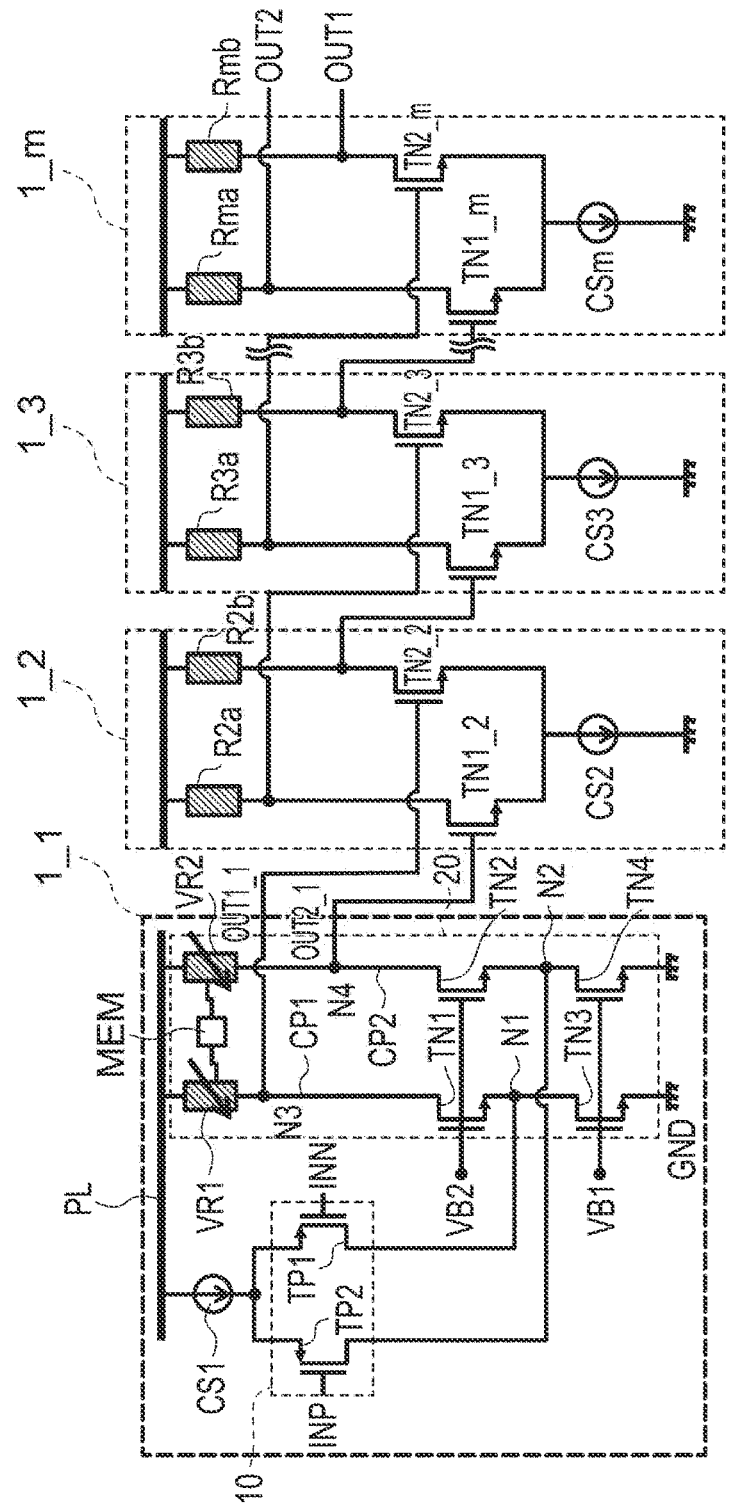
FIG. 4 is a diagram illustrating a specific example of a plurality of the reception circuits connected in series in multiple stages.

FIG. 4 is a diagram illustrating a specific example of a plurality of reception circuits connected in series in multiple stages as illustrated in FIG. 3. The reception circuit 1_1 has the same configuration as the reception circuit 1 illustrated in FIG. 1. Each of the reception circuits 1_2 to 1_m receives output signals from the reception circuit of the preceding stage as input signals, amplifies the input signals, and outputs the amplified input signals to the reception circuit of the subsequent stage. Note that, since configurations of the reception circuits 1_2 to 1_m may be the same, the configuration of the reception circuit 1_2 will be described, and description of the other configurations of the reception circuit 1_3 to 1_m will be omitted.

The reception circuit 1_2 includes a constant current source CS2, N-type transistors TN1_2 and TN2_2, and resistors R2a and R2b. The current source CS2 is connected to the ground GND and is configured to cause a predetermined constant current to flow. The resistor R2a and the N-type transistor TN1_2 are connected in series between the power supply line PL and the current source CS2. The resistor R2b and the N-type transistor TN2_2 are connected in parallel to the resistor R2a and the N-type transistor TN1_2, and are connected in series between the power supply line PL and the current source CS2.

The N-type transistors TN1_2 and TN2_2 preferably configured to have the same characteristics. Furthermore, the resistors R2a and R2b preferably include fixed resistors having the same resistance value. Therefore, a current path including the resistor R2a and the N-type transistor TN1_2 and a current path including the resistor R2b and the N-type transistor TN2_2 are electrically substantially symmetric. At this time, the reception circuit 1_2 becomes a nearly ideal amplifier circuit having no offset in the output signals. The absence of an offset in the output signals means that a voltage difference between the output signals becomes substantially zero in a case where the input signals are the same.

The reception circuits 1_3 to 1_m are configured similarly to the reception circuit 1_2, so that a nearly ideal amplifier circuit having almost no offset in the output signals is obtained. Note that the reception circuits 1_2 to 1_m may have the same gain or different gains.

For example, when m=4, the gain of the reception circuit 1_1 is α1a, the gain of the reception circuit 1_2 is α1b, the gain of the reception circuit 1_3 is α1c, and the gain of the reception circuit 1_4 is α1d. Moreover, when the offset of the output signals of the reception circuit 1_1 (voltage difference between the output signals OUT1_1 and OUT2_1) is ΔV, an output voltage difference ΔVout of the reception circuit 1_4 of a final stage (voltage difference between the output signals OUT1 and OUT2) is expressed by Formula 1: where it is assumed that ΔV is a sufficiently small value.

$$\Delta Vout = \Delta V \times \alpha 1a \times \alpha 1b \times \alpha 1c \times \alpha 1d \qquad \text{(Formula 1)}$$

Ideally ΔV is zero, but actually ΔV has a non-zero value due to process variations and the like. Therefore, ΔVout obtained by amplifying ΔV naturally becomes a value larger than ΔV. Therefore, if the variable resistors VR1 and VR2 are adjusted so as to set ΔVout to 0, the offset of the entire reception circuits 1_1 to 1_4 is canceled, and a reception circuit close to an ideal is obtained.

Even if each of the reception circuits 1_2 to 1_4 has an offset of the output signals with respect to the input signals, by adjusting the variable resistors VR1 and VR2 so as to make ΔVout 0, the offset of the entire reception circuits 1_1 to 1_4 is canceled. If the offset is canceled by the reception circuits 1_1 to 1_4 in this manner, the skew of the entire reception circuits 1_1 to 1_4 is also corrected.

Figure 5A:
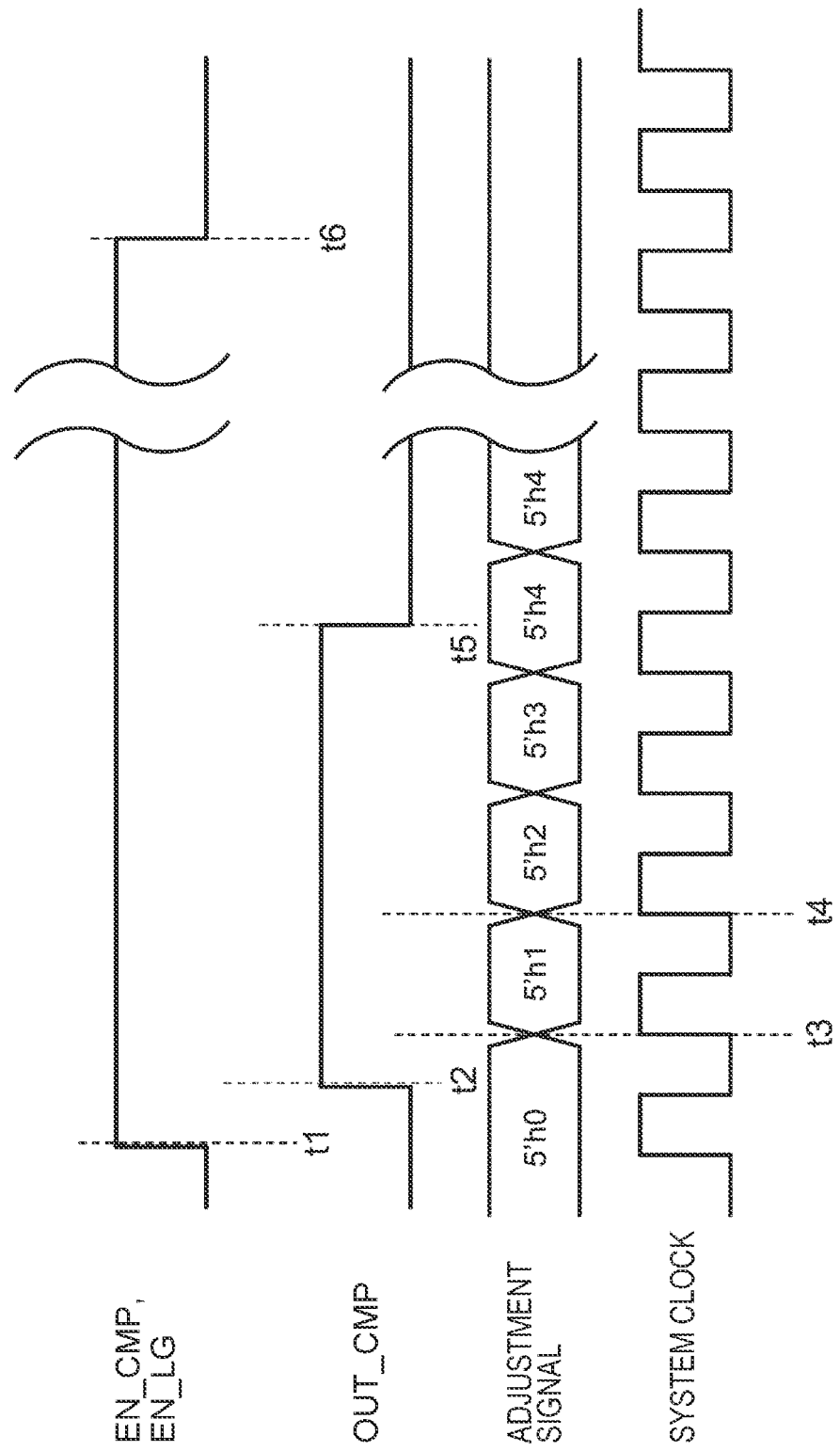
FIG. 5A is a timing chart illustrating an example of the skew correction processing.

FIG. 5A is a timing chart illustrating an example of the skew correction processing. The skew correction processing may be performed in a test of a semiconductor wafer state before the reception circuit is divided into semiconductor chips.

For example, at t1, an enable signal EN_CMP of the comparison circuit CMP and an enable signal EN_LG of the adjustment signal generation circuit LG in FIG. 3 are activated, and the comparison circuit CMP and the adjustment signal generation circuit LG are driven. Therefore, comparison operation and adjustment signal generation operation of the output signals OUT1 and OUT2 of the reception circuit 1_m are started. Thereafter, at t2, an output signal OUT_CMP of the comparison circuit CMP is activated. During a period in which the output signal OUT_CMP is activated, the adjustment signal generation circuit LG continues adjustment of the adjustment signal.

The comparison operation and the adjustment signal generation operation are periodically performed on the basis of a system clock.

In a case where OUT1>OUT2 in the comparison operation at t3, the adjustment signal generation circuit LG increments the adjustment signal by one bit in order to increase the resistance value of the variable resistor VR1. For example, the adjustment signal is incremented from an initial state "5'h0" to "5'h1". Therefore, a voltage difference between OUT1 and OUT2 decreases.

In a case where OUT1>OUT2 in the next comparison operation at t4, the comparison circuit CMP further increments the adjustment signal by one bit. For example, the adjustment signal is incremented from the initial state "5'h1" to "5'h2". Therefore, the voltage difference between OUT1 and OUT2 further decreases.

This is repeated, and at a time point t5 at which a magnitude relationship between OUT1 and OUT2 is reversed (a time point at which OUT1≤OUT2 is satisfied), the output signal OUT_CMP of the comparison circuit CMP is inactivated, and the comparison operation and the adjustment signal generation operation are ended.

The adjustment signal "5'h4" at the time point at which OUT1≤OUT2 is satisfied is written to the storage unit MEM of the reception circuit 1_1. Alternatively, the adjustment signal "5'h3" of a period immediately before the time point at which OUT1≤OUT2 is satisfied may be written in the storage unit MEM of the reception circuit 1_1. Note that the time point at which the magnitude relationship between OUT1 and OUT2 is inverted may be a time point at which the inversion of the output signal OUT_CMP continues for two or more cycles in consideration of influence of noise.

When the adjustment signal is stored in the storage unit MEM, the skew correction processing is completed. Thereafter, the DC power supply DC, the comparison circuit CMP, and the adjustment signal generation circuit LG may be removed from the reception circuits 1_1 to 1_m. The reception circuits 1_1 to 1_m can amplify high frequency signals with low skew in normal operation.

Note that, in a case where OUT1<OUT2 in the comparison operation at t3, the adjustment signal generation circuit LG is only required to decrement the adjustment signal by one bit in order to decrease the resistance value of the variable resistor VR1. This is repeated, and at a time point at which the magnitude relationship between OUT1 and OUT2 is reversed (a time point at which OUT1≥OUT2 is satisfied), the comparison operation and the adjustment signal generation operation are ended. As described above, regardless of whether the voltage difference between OUT1 and OUT2 is positive or negative, the comparison circuit CMP and the adjustment signal generation circuit LG can adjust the variable resistors VR1 and VR2.

In a case where the skew correction processing is not executed in the normal operation after completion of the skew correction processing, it is not necessary to provide the DC power supply DC, the comparison circuit CMP, and the adjustment signal generation circuit LG in the reception circuit. In this case, the skew correction processing is only required to be executed once before shipment. For example, FIG. 5B is a timing chart of a case where the skew correction processing is executed before shipment. Before t1, the reception circuits 1_1 to 1_m have not received a specific input signal. When the skew correction processing is started at t1, the skew correction processing from t1 to t6 described with reference to FIG. 5A is executed. At t5, the adjustment signal is written into the storage unit MEM. In this case, the storage unit MEM is preferably a nonvolatile memory that cannot be rewritten, and may be a fuse and the like. Thereafter, the reception circuits_1 to 1_m enter the normal operation, and input and amplify the high frequency signals.

Figure 6:
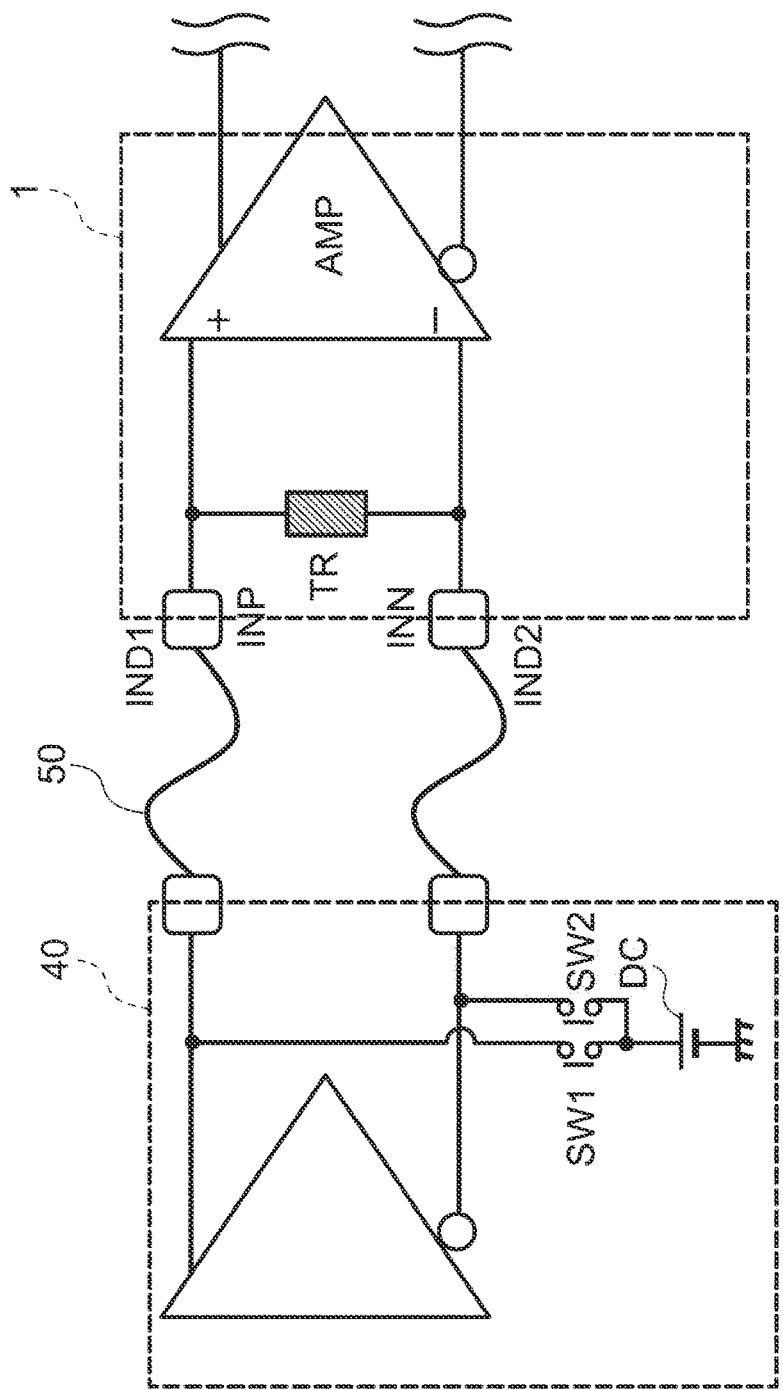
FIG. 6 is a diagram illustrating an example of a connection configuration of a DC power supply.
Figure 7:
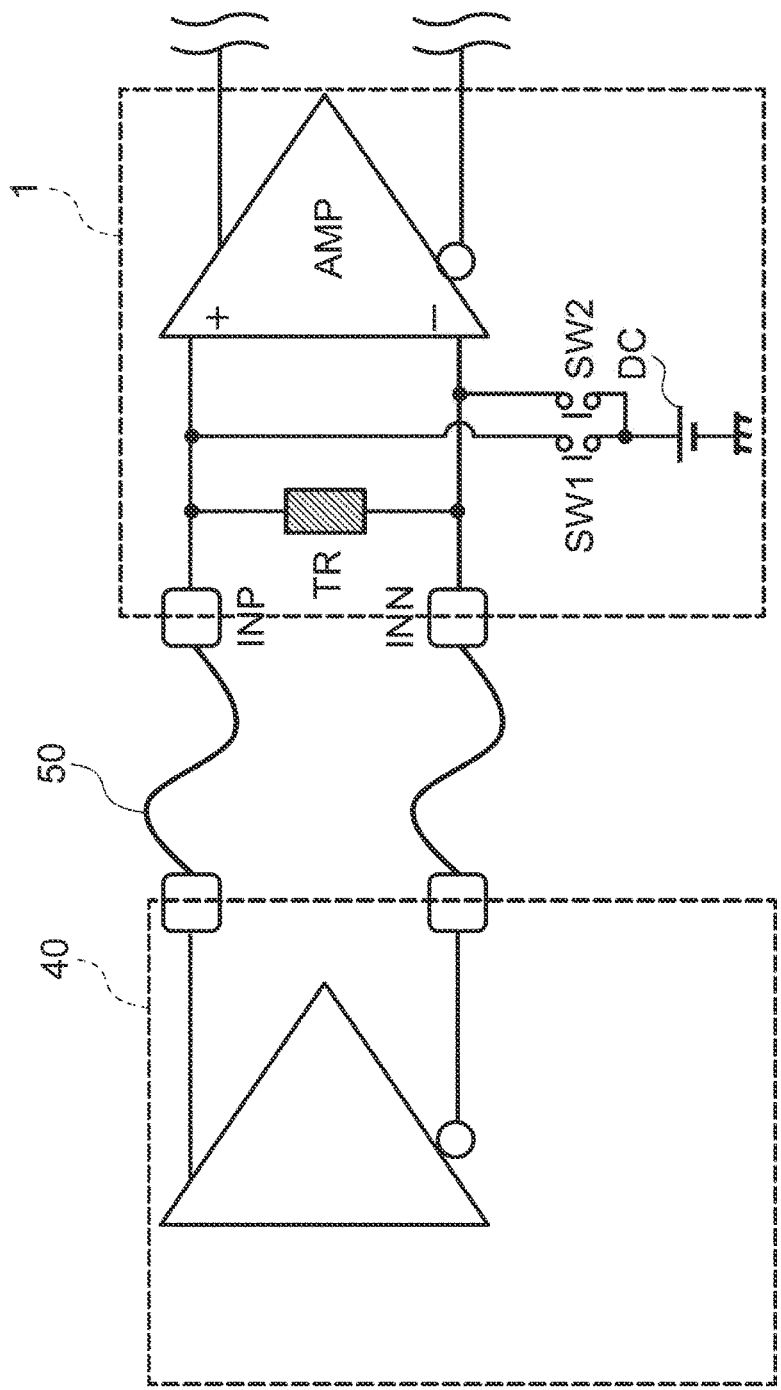
FIG. 7 is a diagram illustrating an example of the connection configuration of the DC power supply.

FIGS. 6 and 7 are diagrams illustrating an example of a connection configuration of the DC power supply DC. The DC power supply DC is connected to a transmission circuit 40 in FIG. 6, and the DC power supply DC is connected to the reception circuit 1 in FIG. 7. Note that only one reception circuit 1 is representatively illustrated in FIGS. 6 and 7, and the DC power supply DC may supply DC power to any of the plurality of reception circuits in FIG. 3.

In FIG. 6, the DC power supply DC is commonly connected to two output units of the transmission circuit 40, and inputs the same DC signal to two input units of the reception circuit 1 via a cable 50. A first switch SW1 is connected between the DC power supply DC and one of the output units of the transmission circuit 40, and can electrically connect or disconnect between the DC power supply DC and the one of the output units of the transmission circuit 40. A second switch SW2 is connected between the DC power supply DC and another of the output units of the transmission circuit 40, and can electrically connect or disconnect between the DC power supply DC and the another of the output units of the transmission circuit 40.

In FIG. 7, the DC power supply DC is commonly connected to two input units of the reception circuit 1, and inputs the same DC signal to the two input units of the reception circuit 1. The first switch SW1 is connected between the DC power supply DC and one of the input units of the reception circuit 1, and can electrically connect or disconnect between the DC power supply DC and the one of the input units of the reception circuit 1. The second switch SW2 is connected between the DC power supply DC and another of the input units of the reception circuit 1, and can electrically connect or disconnect between the DC power supply DC and the another of the input units of the reception circuit 1.

As described above, the first switch SW1 is provided between the DC power supply DC and the one of the input units of the reception circuit 1, and can electrically connect or disconnect between the DC power supply DC and the one of the input units of the reception circuit 1. The second switch SW2 is provided between the DC power supply DC and the another of the input units of the reception circuit 1, and can electrically connect or disconnect between the DC power supply DC and the another of the input units of the reception circuit 1.

In a case where the same DC signal is input from the DC power supply DC to the two input units of the reception circuit 1 in the skew correction processing, both the switches SW1 and SW2 are turned on. On the other hand, in a case where high frequency signals complementary to each other are input to the two input units in the normal operation, both the switches SW1 and SW2 are turned off. Therefore, the reception circuit 1 can receive the same DC signal from the DC power supply DC in the skew correction processing, and the reception circuit 1 can normally receive and amplify the high frequency signals in the normal operation.

After the skew correction processing, the transmission circuit 40 and the cable 50 may be removed from the reception circuit 1. The reception circuit 1 stores settings of the resistance values of the variable resistors VR1 and VR2 in the storage unit MEM. Therefore, the reception circuit 1 can receive the high frequency signals in a corrected state.

As described above, in the present disclosure, the skew of the waveforms of the output signals OUT1 and OUT2 of the reception circuit 1 due to the high frequency signals can be corrected by suppressing the deviation (offset) of the operating point of the reception circuit 1 with the same DC voltage. Therefore, the reception circuit 1 can perform data communication at a higher speed.

Furthermore, even in the reception circuits 1_1 to 1_4 connected in multiple stages, if the variable resistors VR1 and VR2 of the reception circuit 1_1 are adjusted, the offset of the entire reception circuits 1_1 to 1_4 is canceled, and the skew of the entire reception circuits 1_1 to 1_4 can also be corrected.

In the first embodiment, the DC power supply DC, the comparison circuit CMP, and the adjustment signal generation circuit LG may be removed from the reception circuit 1 after the skew correction processing. Therefore, the reception circuit 1 is suitable for miniaturization. Furthermore, steady skew correction processing in the normal operation becomes unnecessary. This leads to reduction in power consumption.

Furthermore, according to the present disclosure, since the skew correction processing is performed by correcting the operating point using the DC power supply DC, a test pattern from the transmission circuit or a test circuit is unnecessary, and a correction time can be shortened.

Second Embodiment

A second embodiment is an example in which the reception circuit according to the present disclosure is applied to the MIPI.

Figure 8:
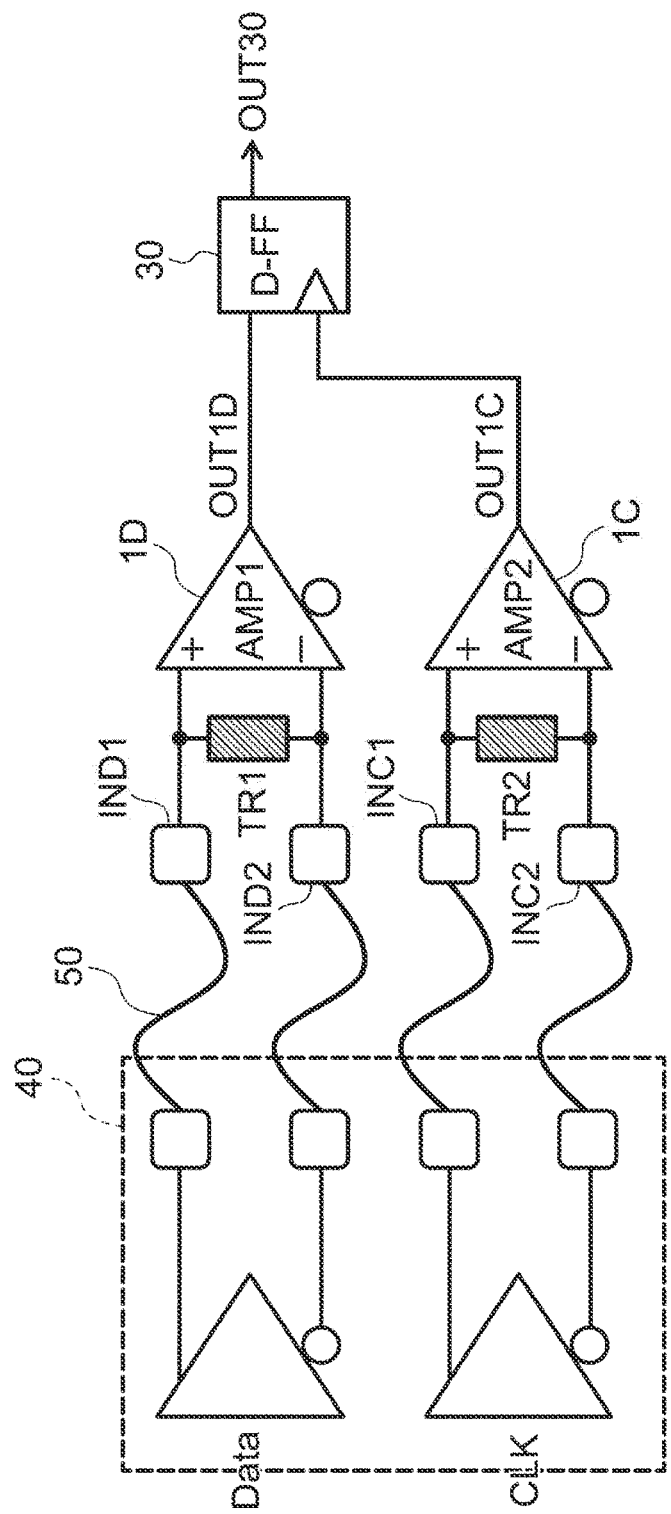
FIG. 8 is a block diagram illustrating a reception circuit portion of MIPI.

FIG. 8 is a block diagram illustrating a reception circuit portion of the MIPI. In the MIPI, as illustrated in FIG. 8, there is a case where a data reception circuit 1D as a first amplification unit that receives and amplifies data and a clock reception circuit 1C as a second amplification unit that receives and amplifies a clock signal are provided. For example, input units IND1 and IND2 of the data reception circuit 1D receive mutually complementary data from the transmission circuit 40. Input units INC1 and INC2 of the clock reception circuit 1C receive mutually complementary clock signals from the transmission circuit 40. A TR1 is a termination resistor provided between the input units IND1 and IND2. A TR2 is a termination resistor provided between the input units INC1 and INC2. Each one of outputs of the data reception circuit 1D and the clock reception circuit 1C is input to a D flip-flop 30. The D flip-flop 30 outputs logic of data as an output signal OUT30 at a rising/falling time point of a clock signal CLK.

In such a reception circuit, the data reception circuit 1D and the clock reception circuit 1C have the same amplifier circuit. However, due to variations in configurations of the data reception circuit 1D and the clock reception circuit 1C, skew occurs between an output signal obtained by amplifying data (data output signal OUT1D) and an output signal obtained by amplifying a clock signal (clock output signal OUT1C). That is, even if the synchronized data and clock signal are input, the data output signal and the clock output signal output from the data reception circuit and the clock reception circuit appear as skew in a time axis direction due to relative variations. This deteriorates a setup/hold timing margin of flip-flops and causes a decrease in operating speed.

Therefore, in the present disclosure, resistance values of the variable resistors VR1 and VR2 are adjusted for each of the reception circuits 1D and 1C of FIG. 8, similarly to the embodiment described above. Therefore, skew in the high frequency signals can be reduced for each of the reception circuits 1D and 1C. Furthermore, skew between the output signal OUT1D and the output signal OUR1C from the reception circuits 1D and 1C is also suppressed by supplying the same DC signal to the reception circuits 1D and 1C to adjust the resistance values of the variable resistors VR1 and VR2.

Note that the data reception circuit and the clock reception circuit in FIG. 8 may be the plurality of reception circuits 1_1 to 1_m connected in multiple stages in FIG. 3.

Figure 9:
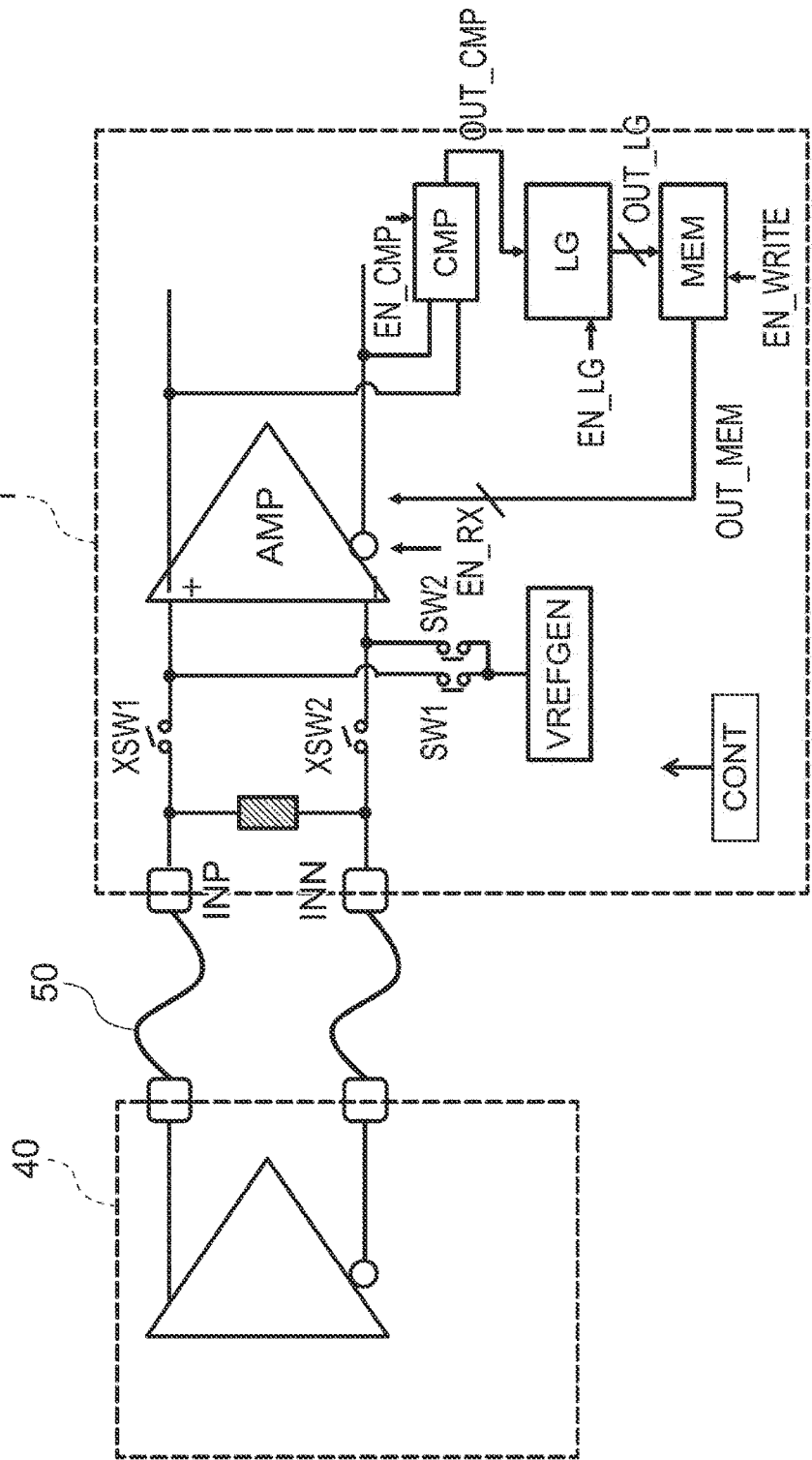
FIG. 9 is a block diagram illustrating a configuration example of the reception circuit incorporating a comparison circuit, an adjustment signal generation unit, a reference voltage generation circuit, and switches.

FIG. 9 is a block diagram illustrating a configuration example of the reception circuit 1 incorporating the comparison circuit CMP, the adjustment signal generation circuit LG, a reference voltage generation circuit VREFGEN, and the switches SW1 and SW2. A controller CONT performs on/off control of switches SW1, SW2, XSW1, and XSW2 and overall control of enable signals EN_CMP, EN_LG, EN_WRITE, EN_RX, and the like.

The skew correction processing is executed, for example, at the time of a test before shipment after manufacturing the reception circuit 1, and is not required to be executed after the shipment. However, even after the shipment of the reception circuit 1, it is also conceivable that the skew correction processing is executed every period in which no high frequency signal is input in the normal operation (for example, a blanking period of the MIPI and the like). In this case, the reception circuit 1 needs to incorporate the comparison circuit CMP, the adjustment signal generation circuit LG, the reference voltage generation unit VREFGEN, and the switches. Note that the reference voltage generation unit VREFGEN may be a DC power supply DC, or may be a conversion circuit that receives power outside the reception circuit 1 and generates DC power. Furthermore, the switches XSW1 and XSW2 are provided between the two input units of the high frequency signals and the reception circuit 1, and can permit or prohibit the high frequency signals from being input to the reception circuit 1. The switches XSW1 and XSW2 operate complementarily to the switches SW1 and SW2, and are turned off when the switches SW1 and SW2 are turned on and turned on when the switches SW1 and SW2 are turned off.

The enable signal EN_CMP is a signal for starting or stopping comparison operation of the comparison circuit CMP. The enable signal EN_LG is a signal for starting or stopping signal generation operation of the adjustment signal generation circuit LG. The enable signal EN_WRITE is a signal that stores resistance values of the variable resistors VR1 and VR2 in the storage unit MEM and temporarily fixes settings of the resistance values. The enable signal EN_RX is a signal for starting or stopping amplification operation of the reception circuit 1.

Figure 10:
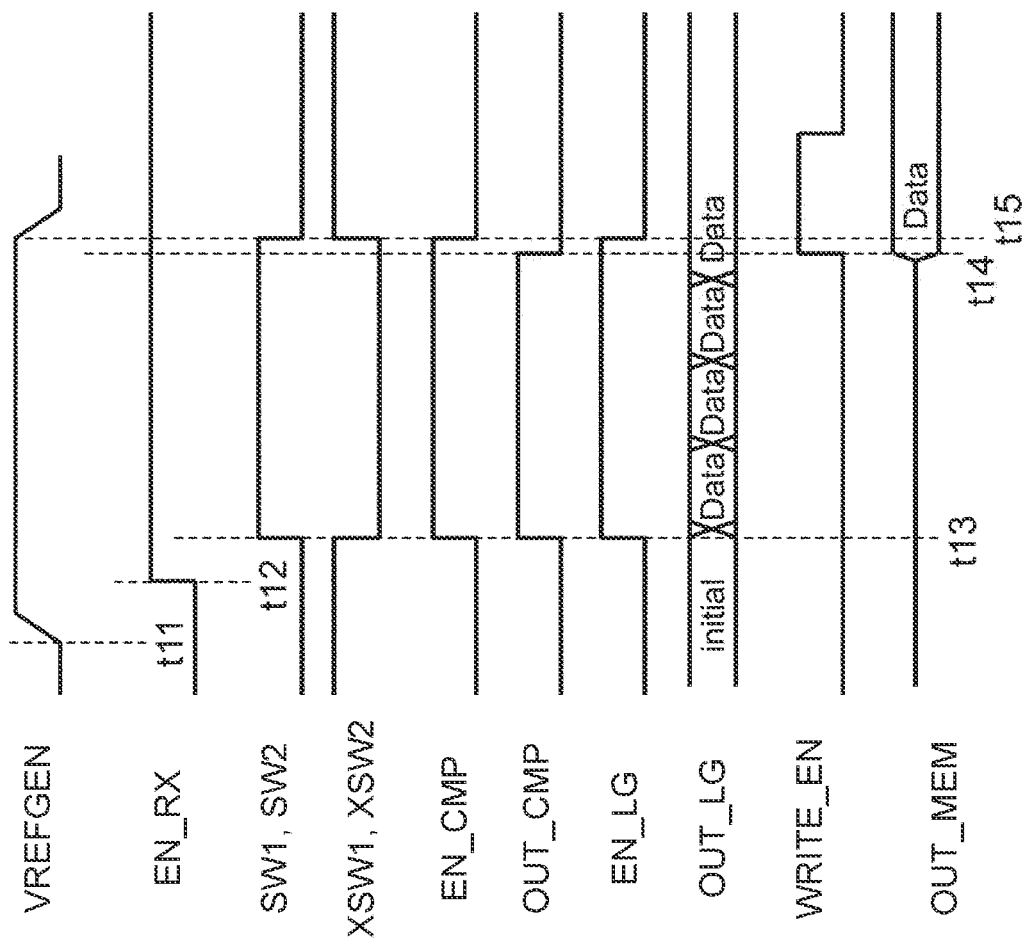
FIG. 10 is a timing chart illustrating an example of operation of the reception circuit in FIG. 9.

FIG. 10 is a timing chart illustrating an example of operation of the reception circuit 1 of FIG. 9.

First, at t11, the reference voltage generation unit VREFGEN is driven to generate and output DC power.

Next, at t12, the enable signal EN_RX is activated, and the reception circuit 1 is driven.

Next, at t13, the controller CONT turns on the switches SW1 and SW2 and turns off the switches XSW1 and XSW2. Therefore, input of the high frequency signal is prohibited, and the DC power from the reference voltage generation unit VREFGEN is input to the reception circuit 1. Furthermore, at this time, the enable signals EN_CMP and EN_LG are also activated, and the comparison circuit CMP and the adjustment signal generation circuit LG are driven. Therefore, the skew correction processing is started.

Therefore, an output signal OUT_CMP of the comparison circuit CMP outputs the output signal OUT_CMP on the basis of a voltage difference between output signals OUT1 and OUT2 of the reception circuit 1. The adjustment signal generation circuit LG increments or decrements an adjustment signal (n-bit data) on the basis of logic of the output signal OUT_CMP. This adjustment signal is output as an output signal OUT_LG. In a case where the enable signal EN_WRITE is in an inactive state, the storage unit MEM outputs the output signal OUT_LG as it is as an output signal OUT_MEM without fixing the output signal OUT_LG. Therefore, the variable resistors VR1 and VR2 of the reception circuit 1 are adjusted.

As described with reference to FIG. 5A, adjustment of the variable resistors VR1 and VR2 is executed for every system clock (not illustrated in FIG. 10). Until the voltage difference between the output signals OUT1 and OUT2 of the reception circuit 1 is inverted (until the logic of the output signal OUT_CMP is inverted), the adjustment signal generation circuit LG repeats incrementing or decrementing the adjustment signal.

At t14, when the logic of the output signal OUT_CMP of the comparison circuit CMP is inverted, the enable signal EN_WRITE is activated, and the storage unit MEM temporarily fixes (stores) the adjustment signal at that time (or one cycle before). Therefore, adjustment of the variable resistors VR1 and VR2 is completed.

At t15, the switches SW1 and SW2 are turned off, and the switches XSW1 and XSW2 are turned on. Furthermore, the enable signals EN_CMP, EN_LG, and the like are brought into an inactive state, and the comparison operation by the comparison circuit CMP is terminated. Therefore, the skew correction processing of the reception circuit 1 ends, and the reception circuit 1 can input high frequency signals.

Although not illustrated, in a case where the skew correction processing is executed again, t11 to t14 is only required to be repeated. When the enable signal EN_WRITE is activated again at t14, the storage unit MEM is only required to rewrite the adjustment signal and temporarily fix (store) the updated adjustment signal.

Figure 11:
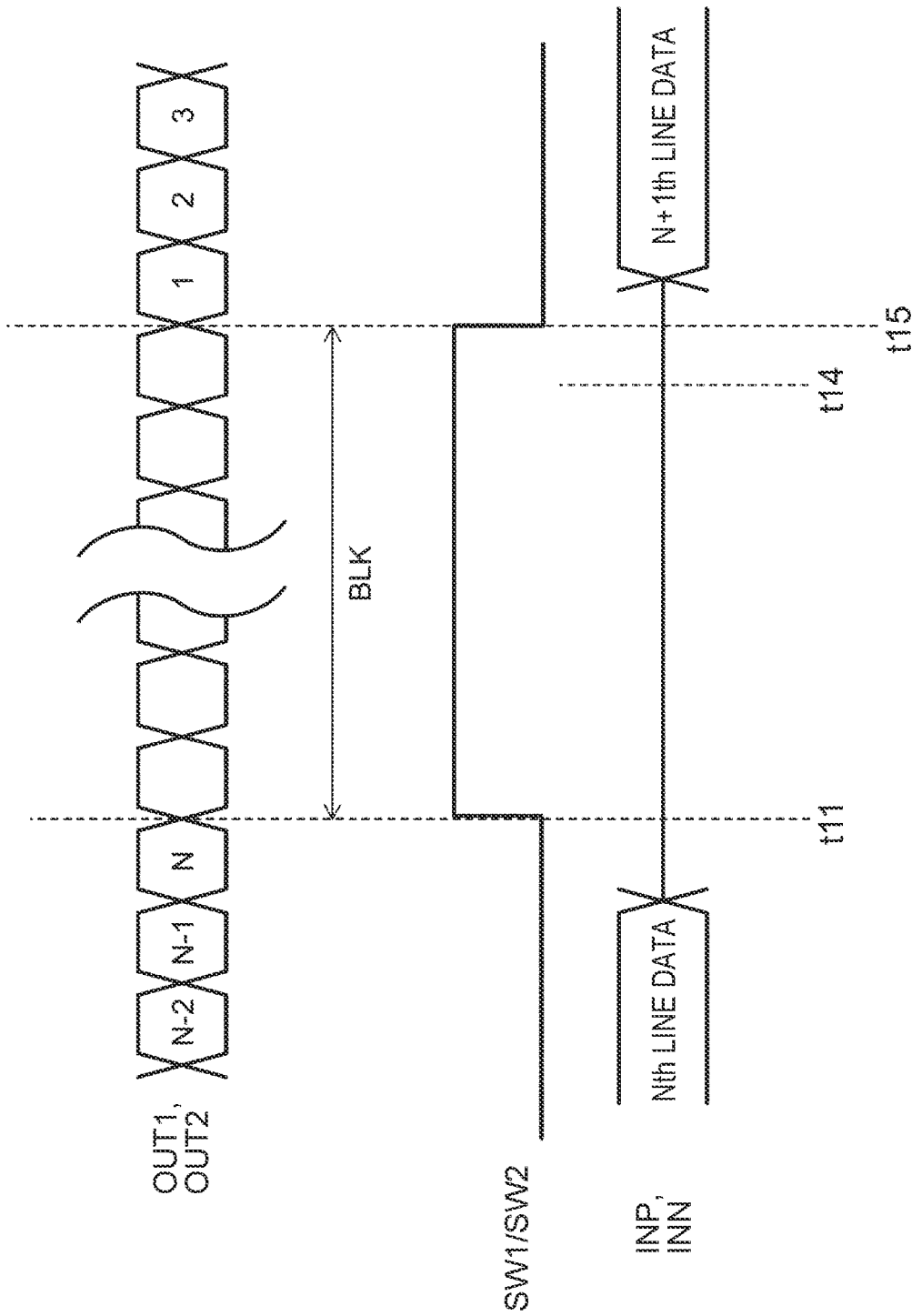
FIG. 11 is a timing chart of a case where the skew correction processing is executed during a blanking period.

As described above, in a case where the reception circuit 1 repeatedly executes the skew correction processing, the skew correction processing is executed during a blanking period of the MIPI. For example, FIG. 11 is a timing chart of a case where the skew correction processing is executed during the blanking period. For example, before t11, the reception circuit 1 amplifies data of an Nth line of an image, and executes the skew correction processing in a blanking period BLK after the amplification processing ends. After the skew correction processing at t11 to t15 described in FIG. 10 is executed, the reception circuit 1 amplifies data of an N−1th line of the image. As described above, the reception circuit 1 may execute the skew correction processing for every blanking period BLK. The blanking period BLK is a period from scanning of one scanning line on an image to a start of the scanning of the next scanning line, or a period from one raster scan to a start of the next raster scan. That is, the adjustment signal generation circuit LG sets the resistance values of the variable resistors VR1 and VR2 in the blanking period from when the two input units receive the mutually complementary high frequency signals as the input signals INP and INN in scanning of a certain scanning line of the image to when scanning of the next scanning line starts. Note that, in FIG. 11, the skew correction processing is executed in the blanking period BLK, but the skew correction processing is not required to be executed after shipment after executing at the time of a test before the shipment. In this case, the storage unit MEM may be a fuse and the like that cannot be rewritten.

In the second embodiment, since the DC power supply DC, the comparison circuit CMP, and the adjustment signal generation circuit LG are incorporated in the reception circuit 1, the skew correction processing can be executed even after shipment. For example, by performing the skew correction processing during the blanking period in a display device and the like, the skew correction processing can be performed for transient power supply fluctuation and temperature fluctuation.

The second embodiment also has an effect of the first embodiment.

Modification 1

Figure 12:
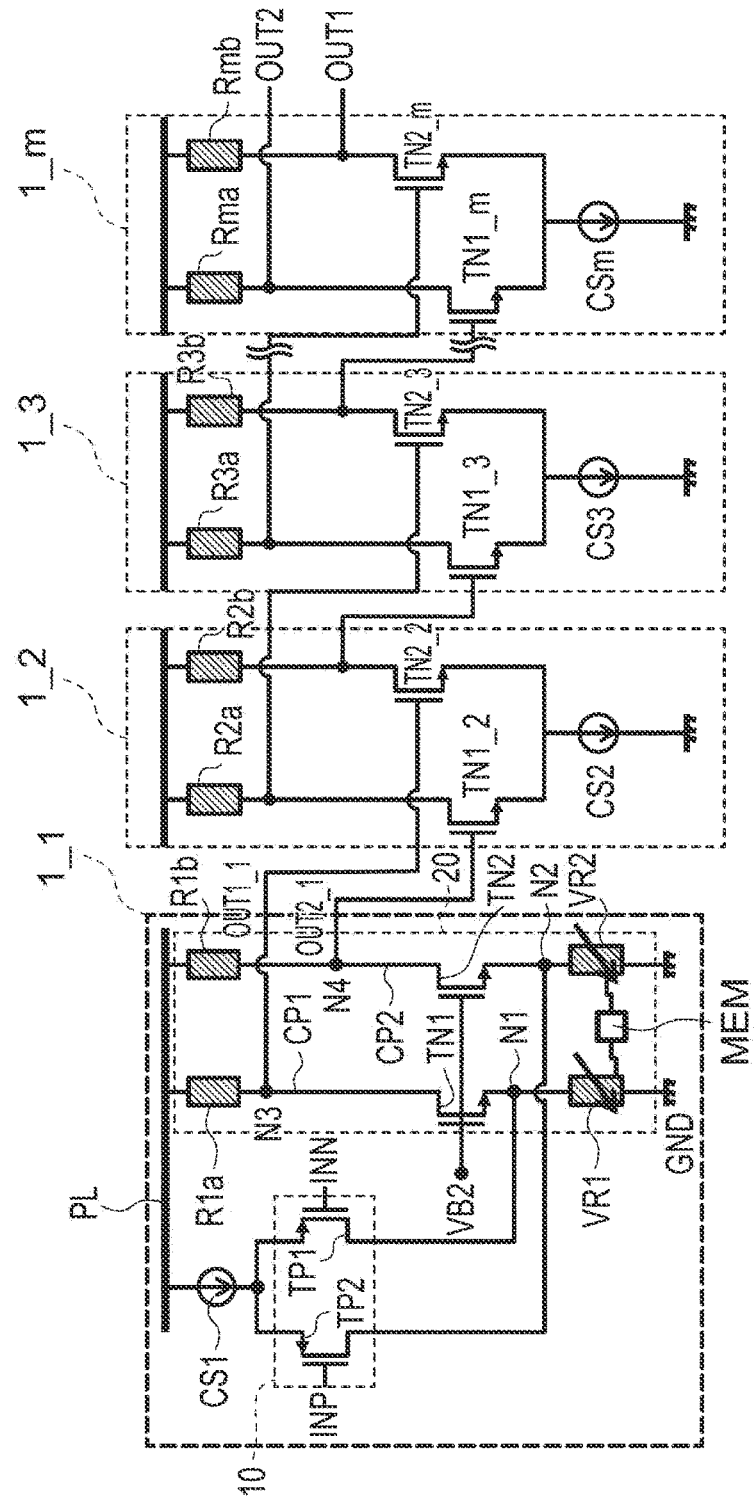
FIG. 12 is a diagram illustrating a configuration example of a multistage connection type reception circuit according to Modification 1.

FIG. 12 is a diagram illustrating a configuration example of a multistage connection type reception circuit according to Modification 1. In Modification 1, the reception circuit 1_1 is different from that illustrated in FIG. 4. In the reception circuit 1_1, the variable resistor VR1 is connected between the N-type transistor TN1 and the ground GND instead of the N-type transistor TN3. Instead of the N-type transistor TN4, the variable resistor VR2 is connected between the N-type transistor TN2 and the ground GND. The variable resistors VR1 and VR2 are provided with the storage unit MEM. Furthermore, a resistor R1a between the power supply line PL and the N-type transistor TN1 and a resistance value T1b between the power supply line PL and the N-type transistor TN2 are fixed resistors whose resistance values do not change. Resistance values T1a and T1b may be equal to each other. The other configurations of the reception circuits 1_2 to 1_m of Modification 1 may be similar to those of FIG. 4.

As described above, instead of the N-type transistors TN3 and TN4, the variable resistors VR1 and VR2 may be provided between the ground GND and the N-type transistors TN1 and TN2, respectively. A method of adjusting the variable resistors VR1 and VR2 in the skew correction processing may be similar to that in the first or second embodiment. Therefore, Modification 1 can obtain an effect similar to that of the first or second embodiment.

Modification 2

Figure 13:
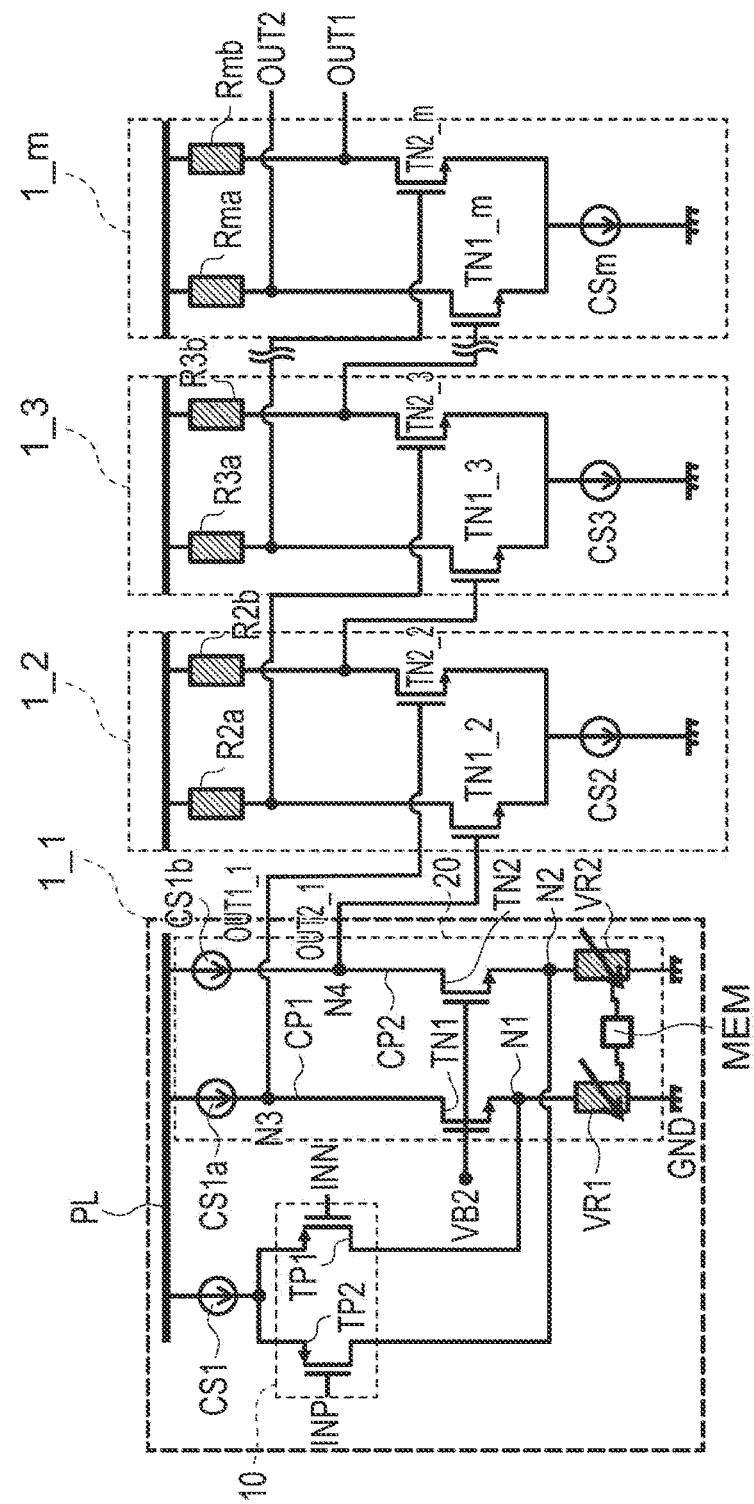
FIG. 13 is a diagram illustrating a configuration example of a multistage connection type reception circuit according to Modification 2.

FIG. 13 is a diagram illustrating a configuration example of a multistage connection type reception circuit according to Modification 2. In Modification 2, the variable resistor VR1 is connected between the N-type transistor TN1 and the ground GND. Instead of the N-type transistor TN4, the variable resistor VR2 is connected between the N-type transistor TN2 and the ground GND. Modification 2 is similar to Modification 1 of FIG. 12 at this point.

However, in Modification 2, a constant current source CS1a is provided between the power supply line PL and the node N3, and a constant current source CS1b is provided between the power supply line PL and the node N4. The other configurations of the reception circuits 1_2 to 1_m of Modification 2 may be similar to those of FIG. 4.

A method of adjusting the variable resistors VR1 and VR2 in the skew correction processing may be similar to that in the first or second embodiment. Therefore, Modification 2 can obtain an effect similar to that of the first or second embodiment.

Figure 14:
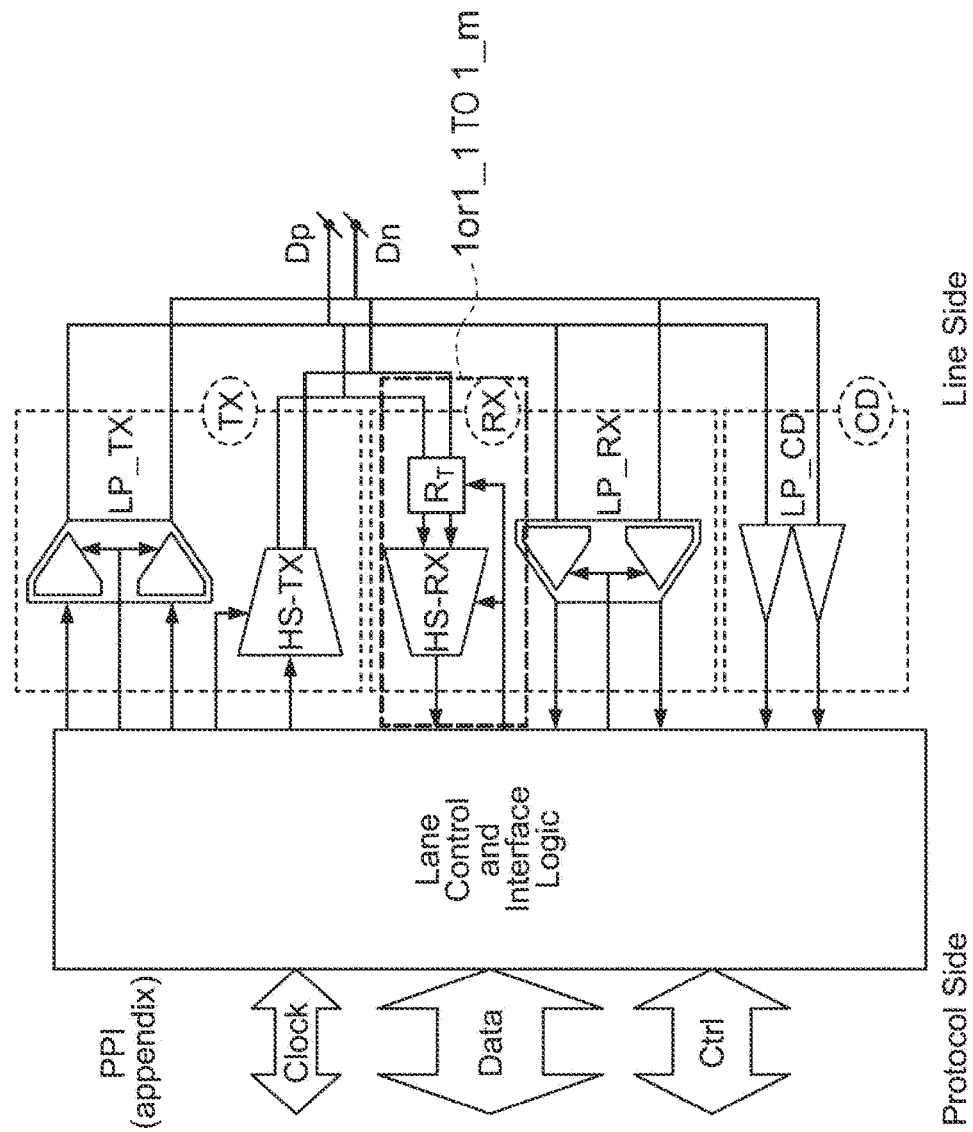
FIG. 14 is a block diagram illustrating a specific example in which the reception circuit of the present disclosure is adapted to a MIPI D-PHY standard.

FIG. 14 is a block diagram illustrating a specific example in which the reception circuit of the present disclosure is adapted to a MIPI D-PHY standard (mipi_D-PHY_specification_v2-0_r08). The reception circuit 1 or 1_1 to 1_m according to the present disclosure is only required to be applied to HS-RX in FIG. 14. Therefore, a lane module of the MIPI D-PHY can perform skew correction processing on a high frequency signal.

For example, in the MIPI, in a case of a transmission rate of 1 Gbps, skew of an output signal needs to be ±0.15 UI (±150 ps) or less. By using the reception circuit according to the present disclosure, requirements of such a specification can be satisfied.

Although some embodiments of the present invention have been described, these embodiments have been presented as examples, and are not intended to limit the scope of the invention. These embodiments can be implemented in various other forms, and various omissions, substitutions, and changes can be made without departing from the gist of the invention. These embodiments and modifications thereof are included in the scope and gist of the invention and are similarly included in the invention described in the claims and an equivalent scope thereof.

(Supplement)

The present technology can also have the following configurations.

(1)

A reception circuit including:
- a first differential stage that receives a first input signal and a second input signal at a first input unit and a second input unit, respectively, and causes first and second currents corresponding to the first and second input signals, respectively, to flow;
- a second differential stage including a first current path that generates and outputs a first amplified signal corresponding to the first current and a second current path that generates and outputs a second amplified signal corresponding to the second current;
- a power supply line that supplies power to the first and second differential stages; and
- at least one variable resistance unit provided in the first or second current path.

(2)

The reception circuit according to (1), in which the variable resistance unit includes
- a first variable resistor provided in the first current path, and
- a second variable resistor provided in the second current path.

(3)

The reception circuit according to (1) or (2), further including a storage unit that stores a resistance value of the variable resistance unit.

(4)

The reception circuit according to (1), in which the variable resistance unit includes
- a first resistance block including a plurality of first resistance elements connected in parallel and a first switch provided between the plurality of first resistance elements, and
- a second resistance block including a plurality of second resistance elements connected in parallel and a second switch provided between the plurality of second resistance elements, and
- in which the first and second resistance blocks are connected in series between the power supply line and the first or second current path.

(5)

The reception circuit according to any one of (1) to (4), further including:
- a DC power supply that inputs the same signal to the first and second input units; and
- a comparison circuit that compares the first and second amplified signals when the same signal is input to the first and second input units,
- in which the variable resistance unit is set so that a voltage difference between the first and second amplified signals decreases.

(6)

The reception circuit according to any one of (1) to claim 4, further including:
- a DC power supply that inputs the same signal to the first and second input units;
- one or a plurality of buffer circuits that is connected to an output of the second differential stage, and outputs third and fourth amplified signals by further amplifying the first and second amplified signals; and
- a comparison circuit that compares the third and fourth amplified signals when the same signal is input to the first and second input units,
- in which the variable resistance unit is set so that a voltage difference between the third and fourth amplified signals decreases.

(7)

The reception circuit according to any one of (1) to (6), further including:
- a DC power supply that inputs the same signal to the first and second input units;
- a first switch provided between the DC power supply and the first input unit; and
- a second switch provided between the DC power supply and the second input unit.

(8)

The reception circuit according to (7), in which the first and second switches are brought into a conductive state in a case where the same signal is input from the DC power supply to the first and second input units, and
- the first and second switches are brought into a nonconductive state in a case where the first and second input signals are input to the first and second input units as mutually complementary high frequency signals.

(9)

The reception circuit according to any one of (1) to (8), further including:
- a first amplification unit and a second amplification unit each including the first differential stage, the second differential stage, the power supply line, and the variable resistance unit,
- in which the first amplification unit receives and amplifies data, and
- the second amplification unit receives and amplifies a clock signal.

(10)

The reception circuit according to any one of (1) to (9), in which the variable resistance unit is provided between the power supply line and a transistor provided in the first or second current path.

(11)

The reception circuit according to any one of (1) to (9), in which the variable resistance unit is provided between a transistor provided in the first or second current path and a ground terminal.

(12)

The reception circuit according to (5), further including:
- a resistance control circuit that changes a resistance value of the variable resistance unit stepwise so that a voltage difference between the first and second amplified signals decreases on the basis of a comparison result of the comparison circuit, and sets the resistance value of the variable resistance unit on the basis of inversion of polarity of the voltage difference between the first and second amplified signals; and a storage unit that stores the resistance value of the variable resistance unit.

(13) The reception circuit according to claim 3 or (13), in which the storage unit stores a set resistance value of the variable resistance unit so as not to be rewritable.

(14) The reception circuit according to claim 3 or (13), in which the storage unit stores a setting of a set resistance value of the variable resistance unit so as to be rewritable.

(15) The reception circuit according to (13), in which the resistance control circuit sets the resistance value of the variable resistance unit in a period from when the first and second input units receive the first and second input signals complementary to each other in scanning of a certain scanning line of an image to when scanning of the next scanning line starts.

REFERENCE SIGNS LIST

1 Reception circuit
10 First differential stage
20 Second differential stage
PL Power supply line
VR1, VR2 Variable resistance unit
CS1 Current source
MEM Storage unit
CS1 Current source
TP1, TP2 P-type transistor
CP1, CP2 Current path
MEM Storage unit
TN1 to TN4 N-type transistor

The invention claimed is:

1. A reception circuit, comprising:
a first differential stage configured to:
receive a first input signal at a first input unit and a second input signal at a second input unit; and
cause a first current to flow corresponding to the first input signal and a second current to flow corresponding to the second input signal;
a second differential stage including a first current path configured to output a first amplified signal corresponding to the first current and a second current path configured to output a second amplified signal corresponding to the second current;
a power supply line configured to supply power to the first differential stage and the second differential stage;
at least one variable resistance unit in the first current path or the second current path;
a DC power supply configured to input a DC signal having substantially a same voltage to each of the first input unit and the second input unit;
one or a plurality of buffer circuits that is connected to an output of the second differential stage, and is configured to:
amplify the first amplified signal to output a third amplified signal; and
amplify the second amplified signal to output a fourth amplified signals; and
a comparison circuit configured to compare the third amplified signal and the fourth amplified signal based on the input of the DC signal to each of the first input unit and the second input unit,
wherein the at least one variable resistance unit is set so that a voltage difference between the third amplified signal and the fourth amplified signal decreases.

2. The reception circuit according to claim 1, wherein the at least one variable resistance unit includes:
a first variable resistor in the first current path, and
a second variable resistor in the second current path.

3. The reception circuit according to claim 1, further comprising a storage unit that is configured to store a resistance value of the at least one variable resistance unit.

4. The reception circuit according to claim 1, wherein the at least one variable resistance unit includes:
a first resistance block including a plurality of first resistance elements connected in parallel and a first switch between the plurality of first resistance elements, and
a second resistance block including a plurality of second resistance elements connected in parallel and a second switch between the plurality of second resistance elements, and
the first resistance block and the second resistance block are connected in series between the power supply line and one of the first current path or the second current path.

5. The reception circuit according to claim 1, wherein the comparison circuit is further configured to compare the first amplified signal and the second amplified signal when the DC signal is input to the first input unit and the second input unit,
wherein the at least one variable resistance unit is set so that a voltage difference between the first amplified signal and the second amplified signal decreases.

6. The reception circuit according to claim 1, further comprising:
a first switch between the DC power supply and the first input unit; and
a second switch between the DC power supply and the second input unit.

7. The reception circuit according to claim 6, wherein the first switch and the second switch are brought into a conductive state in a case where the DC signal is input from the DC power supply to the first input unit and the second input unit, and
the first switch and the second switch are brought into a non-conductive state in a case where the first input signal is input to the first input unit and the second input signal is input to the second input unit as mutually complementary high frequency signals.

8. The reception circuit according to claim 1, further comprising:
a first amplification unit and a second amplification unit, wherein each of the first amplification unit and the second amplification unit includes the first differential stage, the second differential stage, the power supply line, and the at least one variable resistance unit,
wherein the first amplification unit is configured to receive mutually complementary data signals from a transmission circuit, and
the second amplification unit is configured to receive mutually complementary clock signals from the transmission circuit.

9. The reception circuit according to claim 1, wherein the at least one variable resistance unit is between the power supply line and a transistor in the first current path or the second current path.

10. The reception circuit according to claim 1, wherein the at least one variable resistance unit is between a transistor in the first current path or the second current path and a ground terminal.

11. The reception circuit according to claim 5, further comprising:
a resistance control circuit that is configured to:
change a resistance value of the at least one variable resistance unit stepwise so that a voltage difference between the first amplified signal and the second amplified signal decreases on a basis of a comparison result of the comparison circuit; and
set the resistance value of the at least one variable resistance unit on a basis of inversion of polarity of the voltage difference between the first amplified signal and the second amplified signal; and
a storage unit that is configured to store the resistance value of the at least one variable resistance unit.

12. The reception circuit according to claim 3, wherein the storage unit is further configured to store a set resistance value of the at least one variable resistance unit as a non-rewritable value.

13. The reception circuit according to claim 3, wherein the storage unit is further configured to store a setting of a set resistance value of the at least one variable resistance unit to be rewritable.

14. The reception circuit according to claim 11, wherein the resistance control circuit is further configured to set the resistance value of the at least one variable resistance unit in a period between:
a time when the first input unit receives the first input signal and the second input unit receives the second input signal,
wherein the first input signal and the second input signal are complementary to each other in scanning of a first scanning line of an image; and
a time when scanning of a second scanning line next to the first scanning line starts.

15. A reception circuit, comprising:
a first amplification unit and a second amplification unit, wherein each of the first amplification unit and the second amplification unit comprises:
a first differential stage configured to:
receive a first input signal at a first input unit and a second input signal at a second input unit; and
cause a first current to flow corresponding to the first input signal and a second current to flow corresponding to the second input signal;
a second differential stage including a first current path configured to output a first amplified signal corresponding to the first current and a second current path configured to output a second amplified signal corresponding to the second current;
a power supply line configured to supply power to the first differential stage and the second differential stage; and
at least one variable resistance unit in the first current path or the second current path;
wherein the first amplification unit is configured to receive mutually complementary data signals from a transmission circuit, and
the second amplification unit is configured to receive mutually complementary clock signals from the transmission circuit.

16. A reception circuit, comprising:
a first differential stage configured to:
receive a first input signal at a first input unit and a second input signal at a second input unit; and
cause a first current to flow corresponding to the first input signal and a second current to flow corresponding to the second input signal;
a second differential stage including a first current path configured to output a first amplified signal corresponding to the first current and a second current path configured to output a second amplified signal corresponding to the second current;
a power supply line configured to supply power to the first differential stage and the second differential stage;
at least one variable resistance unit in the first current path or the second current path;
a DC power supply configured to input a DC signal having substantially a same voltage to each of the first input unit and the second input unit;
a comparison circuit configured to compare the first amplified signal and the second amplified signal when the DC signal is input to the first input unit and the second input unit;
a resistance control circuit configured to:
change a resistance value of the at least one variable resistance unit stepwise so that a voltage difference between the first amplified signal and the second amplified signal decreases on a basis of a comparison result of the comparison circuit; and
set the resistance value of the at least one variable resistance unit on a basis of inversion of polarity of the voltage difference between the first amplified signal and the second amplified signal,
wherein the resistance value of the at least one variable resistance unit is set in a period between:
a time when the first input unit receives the first input signal and the second input unit receives the second input signal,
wherein the first input signal and the second input signal are complementary to each other in scanning of a first scanning line of an image; and
a time when scanning of a second scanning line next to the first scanning line starts; and
a storage unit configured to store the set resistance value of the at least one variable resistance unit.

* * * * *